(12) United States Patent
Miura et al.

(10) Patent No.: US 6,903,630 B2
(45) Date of Patent: Jun. 7, 2005

(54) SURFACE ACOUSTIC WAVE DEVICE HAVING A POLARIZATION INVERTED REGION

(75) Inventors: Michio Miura, Kawasaki (JP); Masahiko Imai, Kawasaki (JP); Takashi Matsuda, Kawasaki (JP); Masanori Ueda, Yokohama (JP); Osamu Ikata, Yokohama (JP)

(73) Assignee: Fujitsu Media Devices Limited, Kanagawa (JP)

( * ) Notice: Subject to any disclaimer, the term of this patent is extended or adjusted under 35 U.S.C. 154(b) by 32 days.

(21) Appl. No.: 10/437,908

(22) Filed: May 15, 2003

(65) Prior Publication Data

US 2003/0214372 A1 Nov. 20, 2003

(30) Foreign Application Priority Data

May 16, 2002 (JP) ...................................... 2002-140876

(51) Int. Cl.[7] ............................................... H03H 9/64
(52) U.S. Cl. ................... 333/193; 333/195; 310/313 B; 310/357
(58) Field of Search ............................... 333/193–196; 310/313 A, 313 B, 313 D, 357

(56) References Cited

U.S. PATENT DOCUMENTS 5,998,907 A * 12/1999 Taguchi et al. ......... 310/313 R
6,462,632 B1 * 10/2002 Fujii et al. ................... 333/193
6,522,219 B2 * 2/2003 Takamiya et al. ........... 333/133

FOREIGN PATENT DOCUMENTS

| JP | 1-157582 | * 6/1989 | ................. 257/763 |
|---|---|---|---|
| JP | 3-101280 | 4/1991 | |
| JP | 5-275966 | * 10/1993 | ............ 310/313 A |
| JP | 2516817 | 7/1996 | |
| JP | 11-55070 | 2/1999 | |
| JP | 2001-1053579 | 2/2001 | |

OTHER PUBLICATIONS

K. Nakamura et al.; "Effect of a Ferroelectric Inversion Layer on the Temperature Characteristics of SH–Type Surface Acoustic Waves on 36° Y–X LiTaO$_3$ Substrates"; IEEE Trans. on Ultrasonics, Ferroelectrics, and Freq. Control, vol. 41, No. 6, pp. 872–875, Nov., 1994.*
"Theoretical Analysis of SAW Propagation Characteristics under the Strained Medium and Applications for High Temperature Stable High Coupling SAW Substrates," K. Yamanouchi et al., IEEE Trans. On Sonics and Ultrasonics, vol. SU–31, pp. 51–57, 1984.
"Temperature Stable SAW Devices Using Directly Bonded LiTaO$_3$/Glass Substrates," Proc. Of IEEE Ultrasonics Symposium, pp. 335–338, 1998.
"SAW Properties of SiO$_2$/128° Y–K LiNbO$_3$ Structure Fabricated by Magnetron Sputtering Technique," Yamanouchi et al., The 20th Symposium, Nov., 1999.

* cited by examiner

Primary Examiner—Barbara Summons
(74) Attorney, Agent, or Firm—Arent Fox

(57) ABSTRACT

A surface acoustic wave device includes multiple SAW resonators formed on a piezoelectric substrate and connected in a ladder arrangement, the piezoelectric substrate having a polarization inverted region on which either a series-arm resonator or a parallel-arm resonator is formed.

28 Claims, 26 Drawing Sheets

---------- NO POLARIZATION INVERTED REGION

——————— USE OF POLARIZATION INVERTED REGION

---------- NO POLARIZATION INVERTED REGION

———— USE OF POLARIZATION INVERTED REGION

---------- NO POLARIZATION INVERTED REGION

———— USE OF POLARIZATION INVERTED REGION

----- NO POLARIZATION INVERTED REGION

——— USE OF POLARIZATION INVERTED REGION

- - - - - - NO POLARIZATION INVERTED REGION

———— USE OF POLARIZATION INVERTED REGIONS UNDERLYING BUS BARS

SURFACE ACOUSTIC WAVE DEVICE HAVING A POLARIZATION INVERTED REGION

BACKGROUND OF THE INVENTION

1. Field of the invention

The present invention generally relates to devices utilizing a surface acoustic wave (SAW), and more particularly, to improvements in the temperature stability and shape factor of the SAW devices.

2. Description of the Related Art

The SAW device is widely applied to the band-pass filter and duplexer of the cellular phone. In recent years, the filter using the SAW device is required to have higher performance as the cellular phone has higher performance. One of the requirements for the SAW device is to improve the temperature stability because temperature change moves the pass-band frequency range of the filter. As is known, lithium tantalite ($LiTaO_3$, hereinafter simply referred to as LT) is a piezoelectric material having a large electromechanical coupling coefficient, which is advantageous for realizing broad filter characteristics. However, LT has a disadvantage in that it is inferior to quartz crystal in terms of temperature stability. The piezoelectric material has a general tendency of incompatible characteristics such that materials having large electromechanical coupling coefficients such as LT and lithium niobate ($LiNbO_3$, hereinafter simply referred to as LN) have comparatively poor temperature stability, while materials having good temperature stability such as quartz crystal have comparatively small electromechanical coupling coefficients. Thus, a piezoelectric material having both a large electromechanical coupling coefficient and a good temperature stability has been sought for years.

There are various proposals to realize materials having a large electromechanical coupling coefficient and a good temperature ability. For example, Yamanouchi et al. propose a substrate having an LN or LT base and a $SiO_2$ film, which is grown thereon and has a temperature coefficient opposite to that of LN or LT (see IEEE Trans. On Sonics and Ultrasonics., vol. SU-31, pp. 51–57, 1984). Nakamura et al. achieve improvements in temperature stability by forming a polarization inverted region in the LT substrate surface that has a depth less than the involved wavelength and utilizing the electrostatic short-circuit effect thereof (see Japanese Patent No. 2516817). Onishi et al. propose to improve the temperature stability by directly joining a thin piezoelectric substrate and another substrate made of a thick, low-expansion material and thus suppressing contraction and expansion due to change of the temperature of the piezoelectric substrate (see Japanese Laid-Open Patent Application No. 11-55070, Proc. Of IEEE Ultrasonics Symposium, pp. 335–338, 1998). Yamanouchi et al. propose to use adhesive for joining the two substrates (see, Yamanouchi et al. The 20th Symposium, November, 1999).

As described above, there are various proposals to realize the SAW device having a large electromechanical coupling coefficient and good temperature stability. However, the proposals have problems to be solved. The proposal by Yamanouchi et al. has difficulty in controlling the thickness of the $SiO_2$ film and thus obtaining a desired constant film thickness and large SAW propagation loss and. The proposal by Onishi et al. requires the piezoelectric substrate and the low-expansion substrate to have mirror surfaces for joining and causes the bulk wave to be reflected at the joining interface, this degrading the filter characteristics. Yamanouchi et al. also propose to make the back surface of the piezoelectric substrate coarse and join the low-expansion material to the coarse back surface by adhesive (Japanese Laid-Open Patent Application No. 2001-53579). However, this proposal decreases the adhesive force at the joint interface and reduces the degree of improvement in temperature stability.

SUMMARY OF THE INVENTION

The present invention has been made in view of the above circumstances and provides an improved SAW device.

This object of the present invention is achieved by a surface acoustic wave device comprising: multiple SAW resonators formed on a piezoelectric substrate and connected in a ladder arrangement, the piezoelectric substrate having a polarization inverted region on which either a series-arm resonator or a parallel-arm resonator among the multiple SAW resonators is formed.

The above object of the present invention is also achieved by a surface acoustic wave device comprising: multiple SAW resonators formed on a piezoelectric substrate and connected in a ladder arrangement, the piezoelectric substrate having a polarization inverted region on which only some of the multiple SAW resonators are formed.

The above object of the present invention is also achieved by a surface acoustic wave device comprising: first and second filters formed on a piezoelectric substrate each having a ladder arrangement of SAW resonators, at least one of the SAW resonators of the first filter being formed on a polarization inverted region formed in the piezoelectric substrate, at least one of the SAW resonators of the second filter being formed on another polarization inverted region formed in the piezoelectric substrate.

The above object of the present invention is also achieved a surface acoustic wave device comprising: a piezoelectric substrate; electrode fingers arranged in an interdigital fashion; and polarization inverted regions that are formed in the piezoelectric substrate and are close to the electrode fingers.

The above object of the present invention is also achieved by a surface acoustic wave devices comprising: a substrate; multiple pairs of comb-like electrodes formed on the substrate and arranged in line; a pair of reflectors between which the multiple pairs of comb-like electrodes are arranged in line, the pair of reflectors being formed on the substrate; and polarization inverted regions formed in the substrate and arranged so as to confine surface acoustic waves excited by the multiple pairs of comb-like electrodes.

BRIEF DESCRIPTION OF THE DRAWINGS

Preferred embodiments of the present invention will be described in detail based on the following accompanying drawings, in which.

DESCRIPTION OF THE PREFERRED EMBODIMENTS

Figure 1:
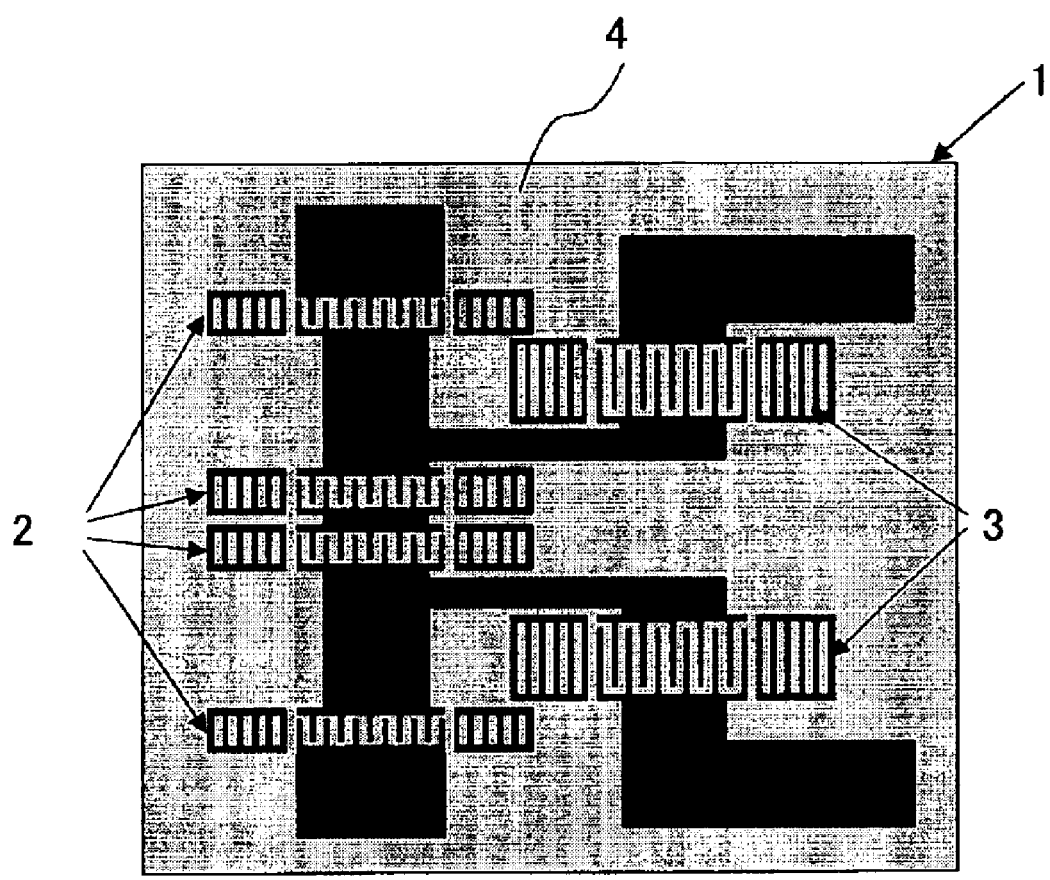
FIG. 1 is a plan view of a conventional SAW device.

The inventors studied the proposal to form the polarization inverted region by Nakamura et al. This proposal realizes improved temperature stability. However, the inventors verified the proposal and found out a problem to be solved. This problem is that the presence of the polarization inverted region degrades the SAW excitation efficiency. The inventors experimentally manufactured a SAW device with a band-pass range in the 900 MHz band shown in FIG. 1, and measured the characteristics thereof. Referring to FIG. 1, the SAW device has a chip 1 formed by a piezoelectric substrate, on which four series-arm resonators 2 and three parallel-arm resonators 3 are formed in a ladder arrangement. A polarization inverted region 4 is formed in the entire main surface of the chip 1 and is the main surface of the chip 1. That is, all the series-arm resonators 2 and the parallel-arm resonators 3 are formed on the polarization inverted region 4.

Figure 2:
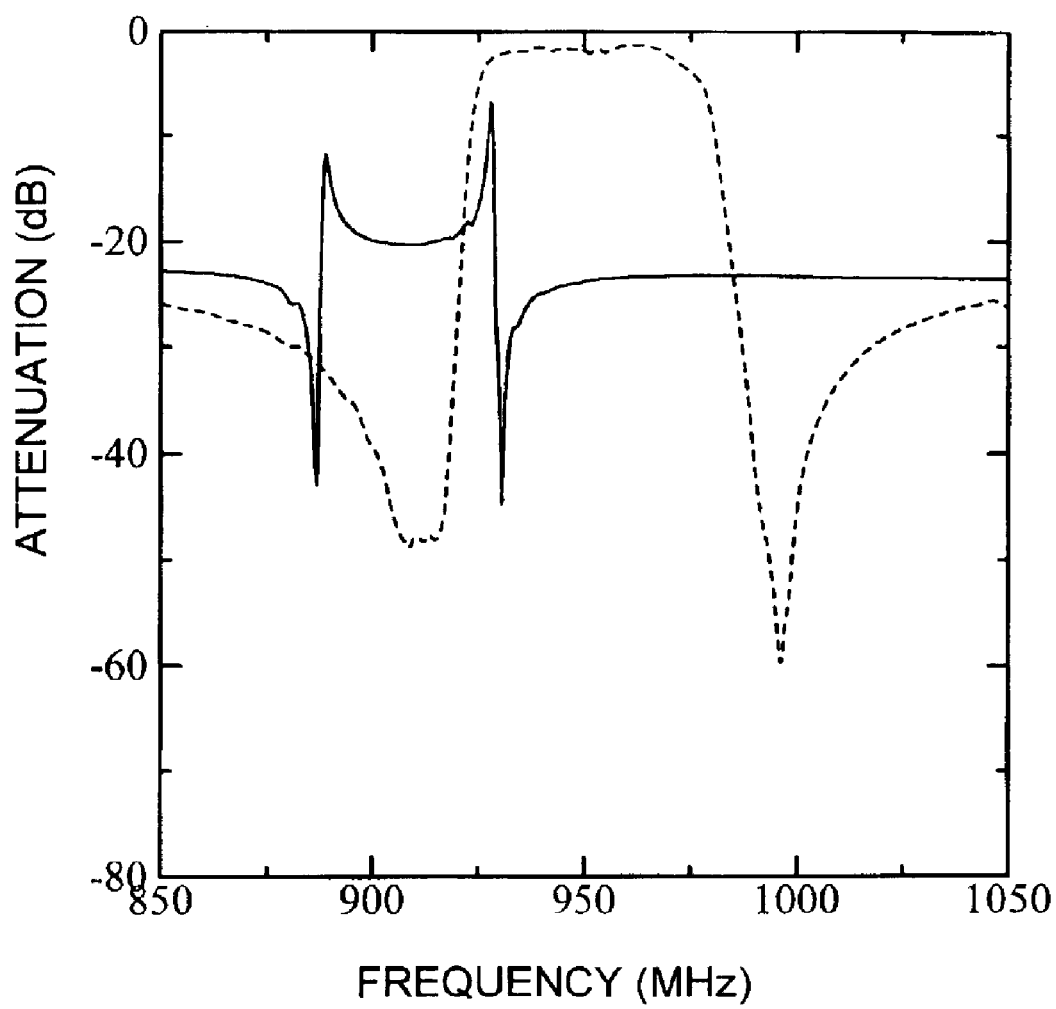
FIG. 2 is a graph of the frequency characteristic of the conventional SAW device shown in FIG. 1.

A solid line shown in FIG. 2 is the frequency characteristic of the filter shown in FIG. 1. A broken line is the frequency characteristic of a SAW filter having no polarization inverted region. It can be seen from FIG. 2 that the filter having the polarization inverted region 4 has a large loss in the pass-band range and fails to have the satisfactory filter characteristics.

The polarization inverted region 4 contributes to improvement in the temperature characteristic, and on the other hand, degrades the SAW excitation efficiency. Thus, it is very difficult to realize practicable SAW filters that have the arrangement shown in FIG. 1.

The present invention is based on the above consideration and is intended to provide a SAW device with improved excitation efficiency and filter characteristics.

A description will now be given of embodiments of the present invention with reference to the accompanying drawings.

First Embodiment

Figure 3:
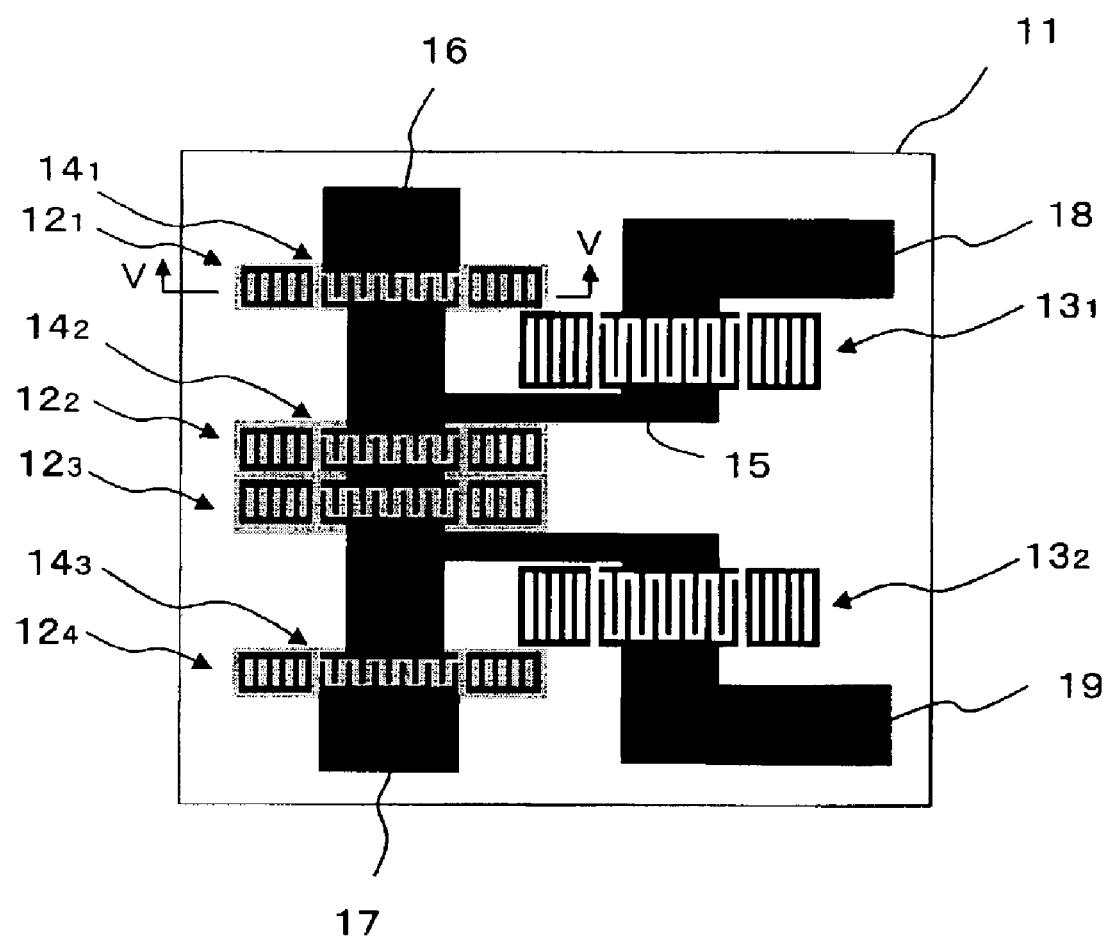
FIG. 3 is a plan view of a SAW device according to a first embodiment of the present invention.

FIG. 3 is a plan view of a SAW device according to a first embodiment of the present invention. The SAW device includes a chip formed by a piezoelectric substrate such as a piezoelectric crystal of LT or LN, on which four series-arm resonators $12_1$, $12_2$, $12_3$ and $12_4$ and two parallel-arm resonators $13_1$ and $13_2$ are formed. These resonators are connected by an interconnection pattern 15 in a ladder arrangement. The SAW device thus configured functions as a ladder-type SAW filter, and more particularly, as a band-pass filter. Each of the series-arm resonators $12_1$–$12_4$ and the parallel-arm resonators $13_1$ and $13_2$ has a pair of comb-like electrodes and pairs of reflector electrodes, each of which pairs is arranged on the respective side of the pair of comb-like electrodes. Each of the pairs of reflector electrodes is a grating reflector. A reference numeral 16 indicates an input terminal of the SAW device, and a reference numeral 17 indicates an output terminal thereof. A reference numeral 18 indicates a terminal connected to the parallel-arm resonator $13_1$, and a reference numeral 19 indicates a terminal connected to the parallel-arm resonator $13_2$.

Figure 4:
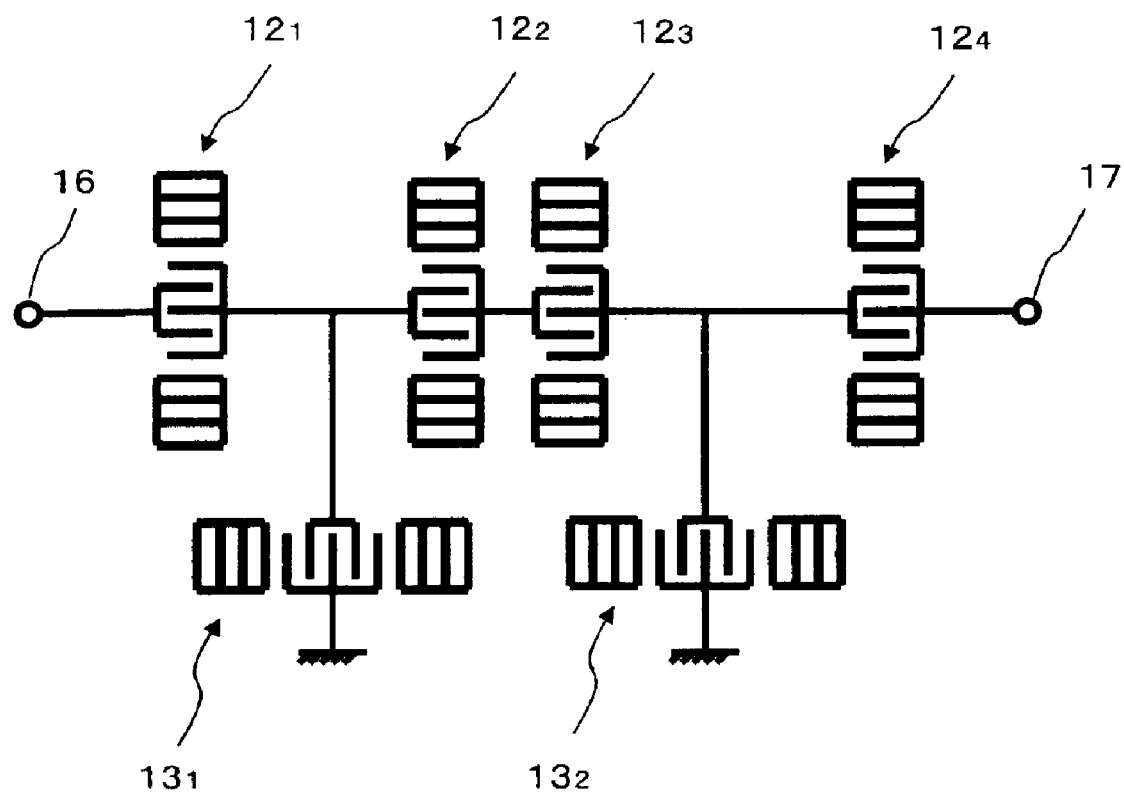
FIG. 4 is a circuit diagram of the SAW device shown in FIG. 3.

FIG. 4 schematically illustrates the circuitry of the ladder-type SAW filter shown in FIG. 3. The terminals 18 and 19 connected to the parallel-arm resonators $13_1$ and $13_2$ are grounded.

Turning to FIG. 3 again, the SAW device has polarization inverted regions $14_1$, $14_2$ and $14_3$ on which the series-arm resonators $12_1$–$12_4$ are formed as shown. More particularly, the polarization inverted region $14_1$ is evenly formed under the pair of comb-like electrodes and the pair of reflectors of the series-arm resonator $12_1$. The series-arm resonators $12_2$ and $12_3$ are formed on the polarization inverted region $14_2$, which is commonly provided thereto. The polarization inverted region $14_3$ is formed below the series-arm resonator $12_4$. In contrast, the parallel-arm resonators $13_1$ and $13_2$ are formed directly on the chip 11, in other words, on the piezoelectric substrate. The arrangement of the polarization inverted regions $14_1$, $14_2$ and $14_3$ provided only to the series-arm resonators $12_1$–$12_4$ minimizes degradation of the SAW excitation efficiency of the whole filter and brings about improved band-pass characteristics. Particularly, the falling end of the pass band on its high-frequency side is hardly affected by temperature variation.

Figure 5:
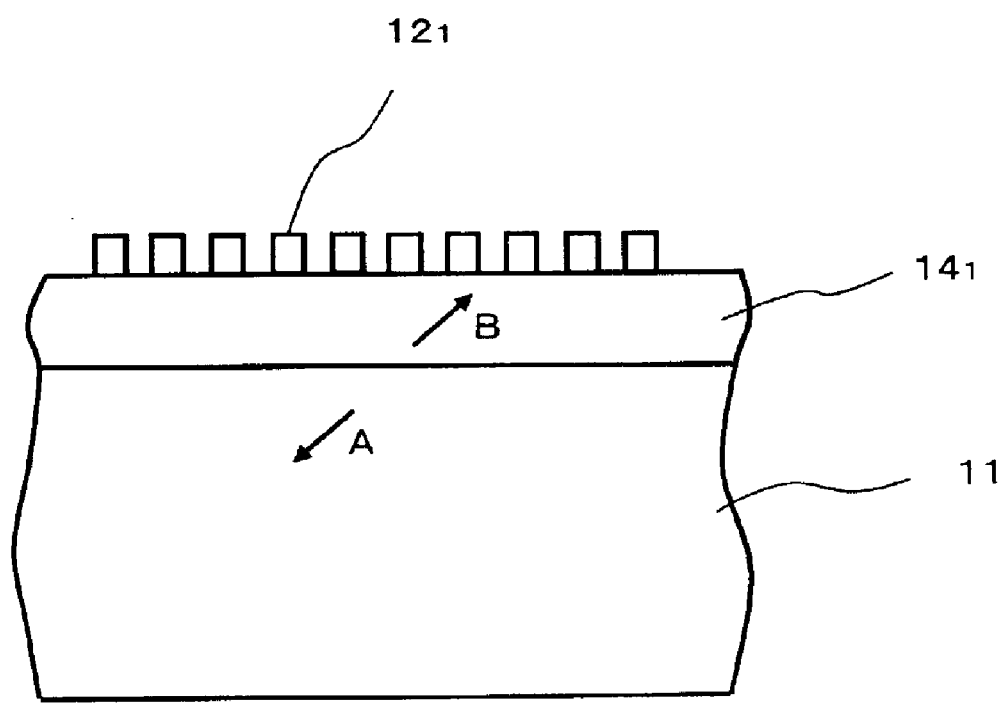
FIG. 5 is a cross-sectional view taken along a line V—V shown in FIG. 3.

FIG. 5 is a cross-sectional view taken along a line V—V shown in FIG. 3. The polarization inverted region $14_1$ for the series-arm resonator $12_1$ is formed in the main surface of the chip, that is, the surface of the piezoelectric substrate. When the chip 1 is polarized in a direction indicated by an arrow A, the direction of polarization of the polarization inverted region $14_1$ is indicated by an arrow B, so that the directions A and B make an angle of 180 degrees. As will be described later, the depth of the polarization inverted region $14_1$ is preferably equal to or less than twice the wavelength of the SAW (SAW wavelength) excited by the series-arm resonator $12_1$.

The polarization inverted regions $14_1$–$14_3$ can be formed by the following process. The surface of a piezoelectric substrate is covered by a tantalum (Ta) film except regions in which polarization should be inverted before the substrate is divided into chips. The tantalum film is, for example, 300 nm thick. The piezoelectric substrate may, for example, be a 42° Y-cut X-propagation LT. Next, the piezoelectric substrate is dipped into pyrophosphoric acid (90% concentration) for 20 minutes at 260° C. Then, the piezoelectric substrate is annealed for one to three hours at an appropriate temperature just below the Currie temperature of LT (about 605° C.).

The above process results in the polarization inverted regions $14_1$–$14_3$ that are approximately 1 μm deep. This depth is approximately equal to ½ of a SAW wavelength of 2.1 μm of the 1.9 GHz band filter. The polarization inverted region decreases the SAW velocity that depends on the depth thereof. It is therefore required to adjust the pitch of the electrode fingers, namely, the SAW wavelength.

Figure 6:
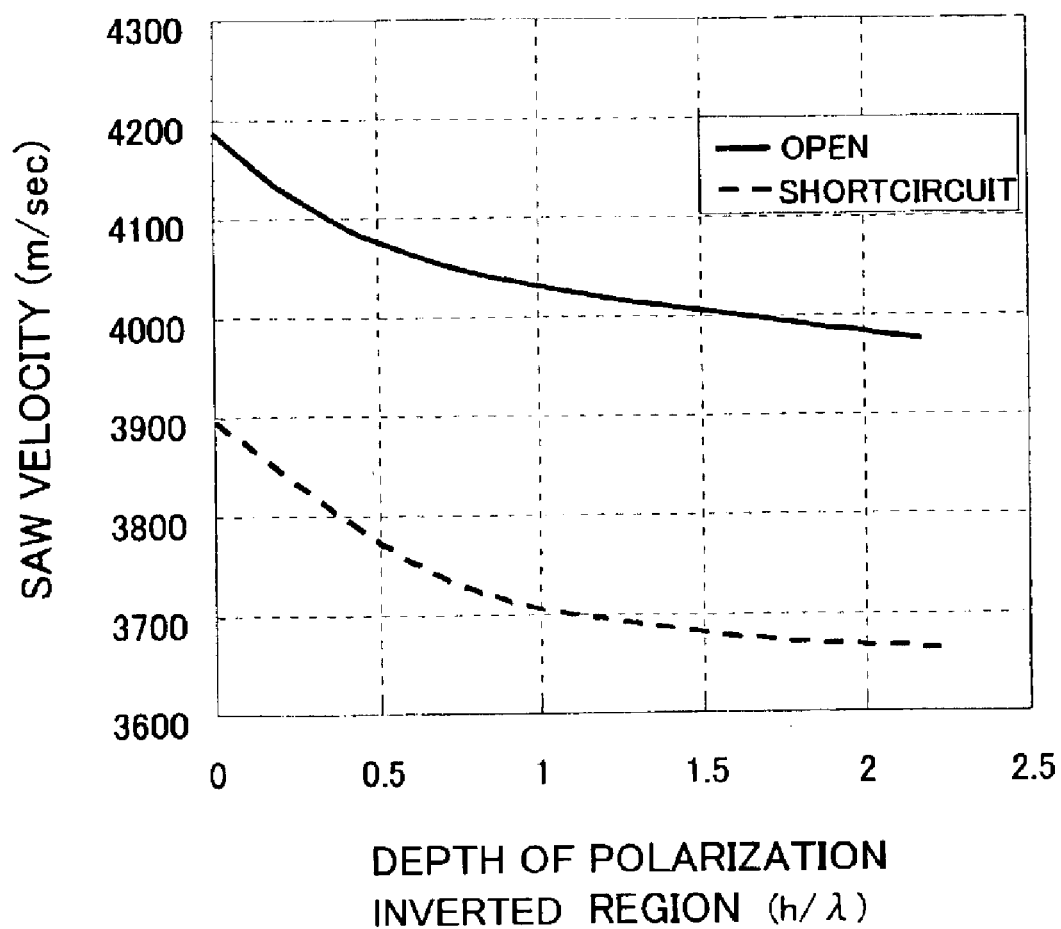
FIG. 6 is a graph showing a relationship between the SAW velocity and the depth of a polarization inverted region formed in the substrate of a SAW device.

FIG. 6 shows results of measuring the SAW velocity as a function of the depth of the polarization inverted region. The horizontal axis of the graph of FIG. 6 denotes a value (h/λ) obtained by normalizing the depth h of the polarization inverted region by the SAW wavelength λ, and the vertical axis thereof denotes the SAW velocity (m/sec). An open surface shown in FIG. 6 denoted by the solid line means that nothing is formed on the main surface of the substrate along which the SAW propagates, and a short-circuit surface denoted by the broken line means that a conductive substance such as an electrode is provided on the main surface. Irrespective of whether the main surface of the piezoelectric substrate is open or short-circuited, the SAW velocity decreases as the polarization inverted region becomes deeper, and decreases very slowly after the depth exceeds twice the SAW wavelength.

Preferably, the SAW wavelength is adjusted based on the data shown in FIG. 6. For example, when the SAW wavelength of the filter having no polarization inverted region is 2.11 μm for the series-arm resonators and 2.17 μm for the parallel-arm resonators, the series-arm resonators $12_1$–$12_4$ of the filer having the aforementioned polarization inverted regions $14_1$–$14_3$ have a pitch or period of 2.031 μm and the parallel-arm resonators $13_1$ and $13_2$ have a pitch of 2.12 μm. It is to be noted that the SAW wavelengths of the parallel-arm resonators $13_1$ and $13_2$ are changed although no polarization inverted regions are applied thereto. This is because the excitation efficiency of the series-arm resonators $12_1$–$12_4$ is decreased due to the presence of the polarization inverted regions $14_1$–$14_3$ and it is therefore required to reduce the difference in frequency between the series-arm resonators $12_1$–$12_4$ and the parallel-arm resonators $13_1$ and $13_2$ in order to define the pass band with small insertion loss. The SAW filter thus configured has an improved shape factor on the high frequency side of the pass band and improved frequency-temperature characteristics.

Figure 7:
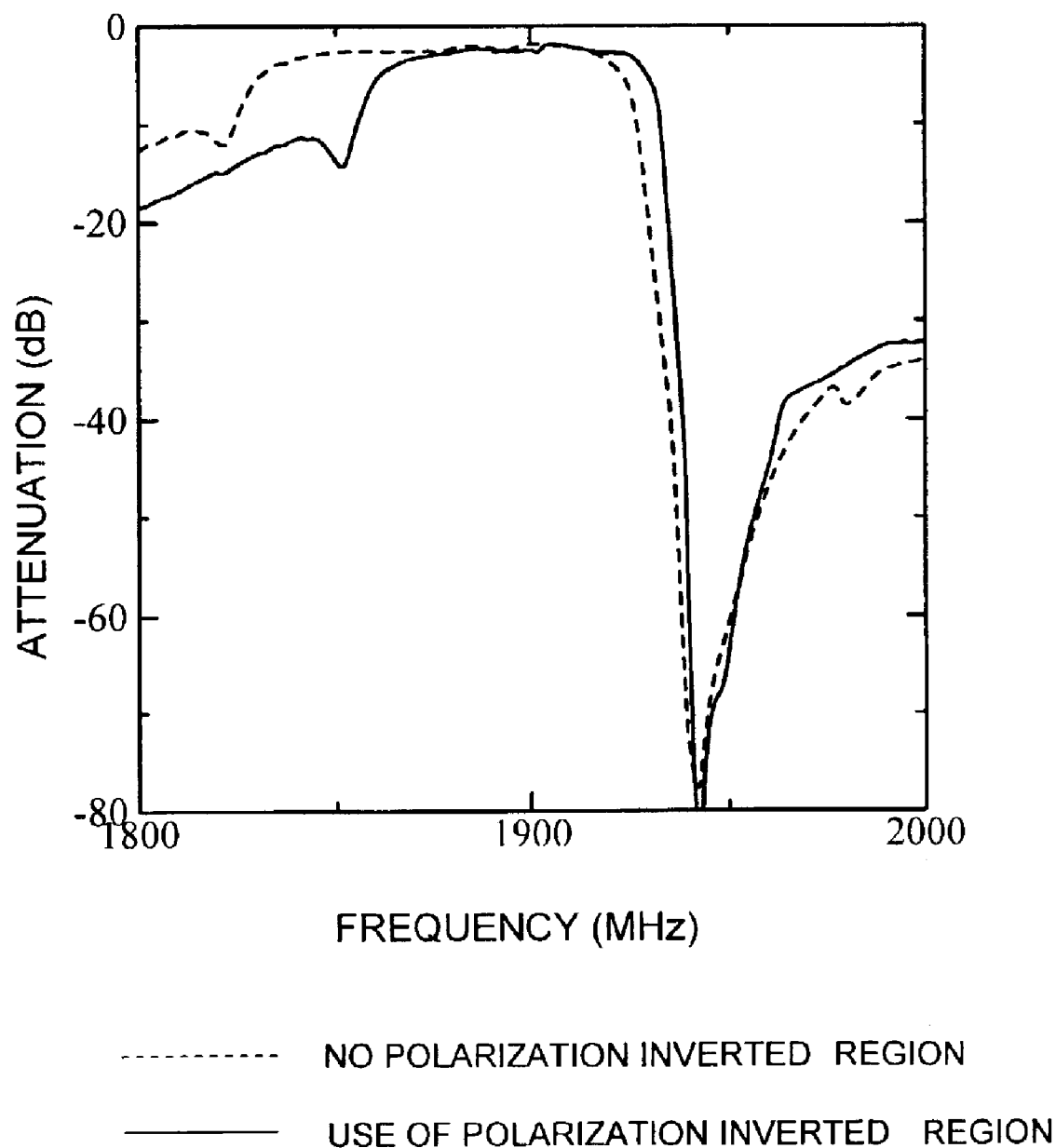
FIG. 7 is a graph of frequency characteristics of the SAW filter according to the first embodiment of the present invention and the conventional SAW device.

FIG. 7 is the filter characteristic of the ladder-type SAW filter according to the first embodiment of the present invention. FIG. 7 also shows the frequency characteristic of a conventional filter that does not have any polarization inverted region. In the conventional filter, it takes a frequency of 17 MHz to obtain a change of loss from –3.5 dB to –42 dB on the high frequency side of the pass band. In contrast, only a frequency of 12.5 MHz is needed to obtain the same change of loss by the SAW filter having the polarization inverted regions $14_1$–$14_3$ underlying the series-arm resonators $12_1$–$12_4$. That is, the SAW filter according to the first embodiment of the present invention has an improved shape factor and a sharper falling end of the pass band on the high frequency side. In addition, the SAW filter according to the first embodiment of the present invention has a frequency-temperature characteristic of –37 ppm/° C. on the high-frequency side of the pass band, which is improved by 3 ppm/° C., as compared to the conventional filter that has a frequency-temperature characteristic of –40 ppm/° C.

Second Embodiment

Figure 8:
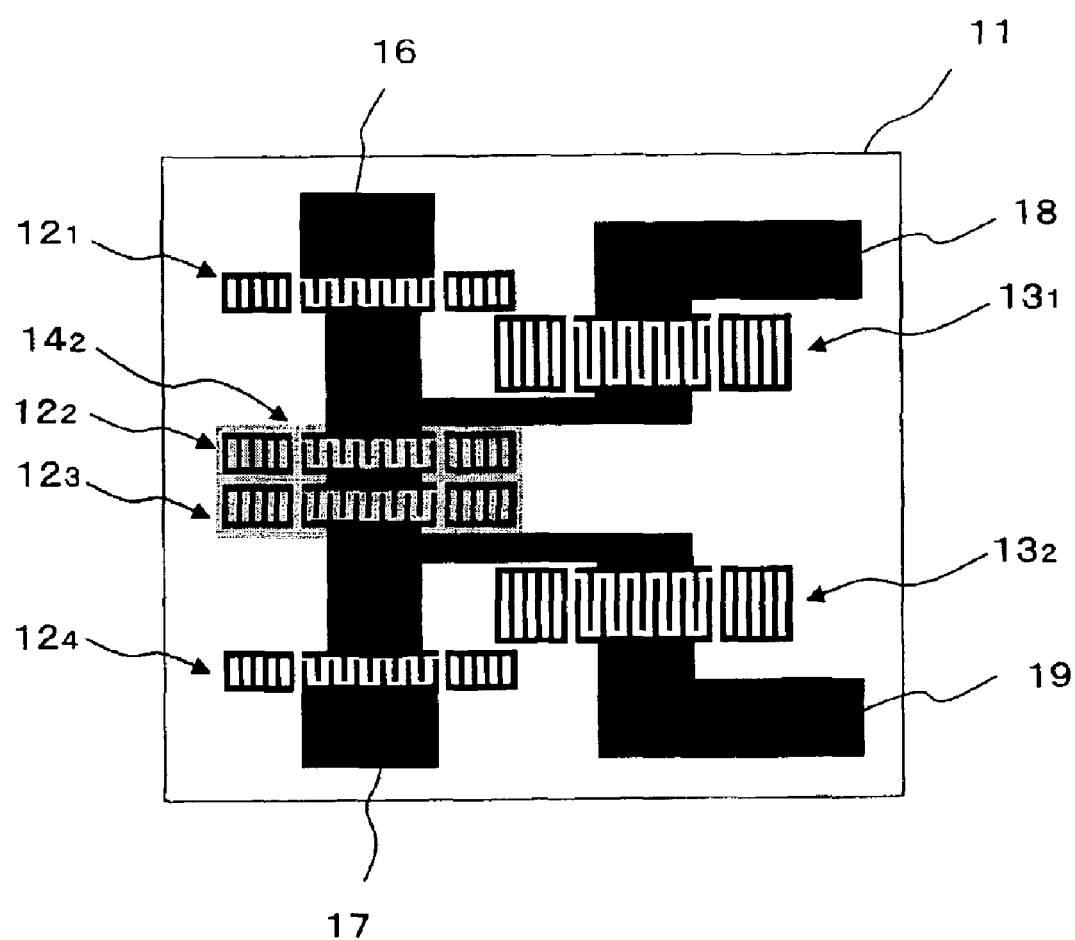
FIG. 8 is a plan view of a SAW device according to a second embodiment of the present invention.

FIG. 8 is a plan view of a SAW device according to a second embodiment of the present invention. In FIG. 8, parts that are the same as those shown in the previously described figures are given the same reference numerals as previously. In the present embodiment, only two series-arm resonators $12_2$ and $12_3$ among the four series-arm resonators $12_1$–$12_4$ are commonly given the polarization inverted region $14_2$. That is, the present embodiment has an arrangement in which all the series-arm resonators are not formed on the polarization inverted regions, but only one or some of the series-arm resonators are formed on the polarization inverted region or regions. The remaining series-arm resonators $14_1$ and $14_4$ are formed directly on the chip 11. The polarization inverted region $14_2$ is formed to a depth of approximately 1.5 μm by dipping the piezoelectric substrate into pyrophosphoric acid (90% concentration) for 30 minutes at 260° C. The series-arm resonators $12_2$ and $12_3$ formed on the polarization inverted region $14_2$ has a pitch (wavelength) of 1.918 μm, while the series-arm resonators $12_1$ and $12_4$ has a pitch of 2.11 μm.

Figure 9:
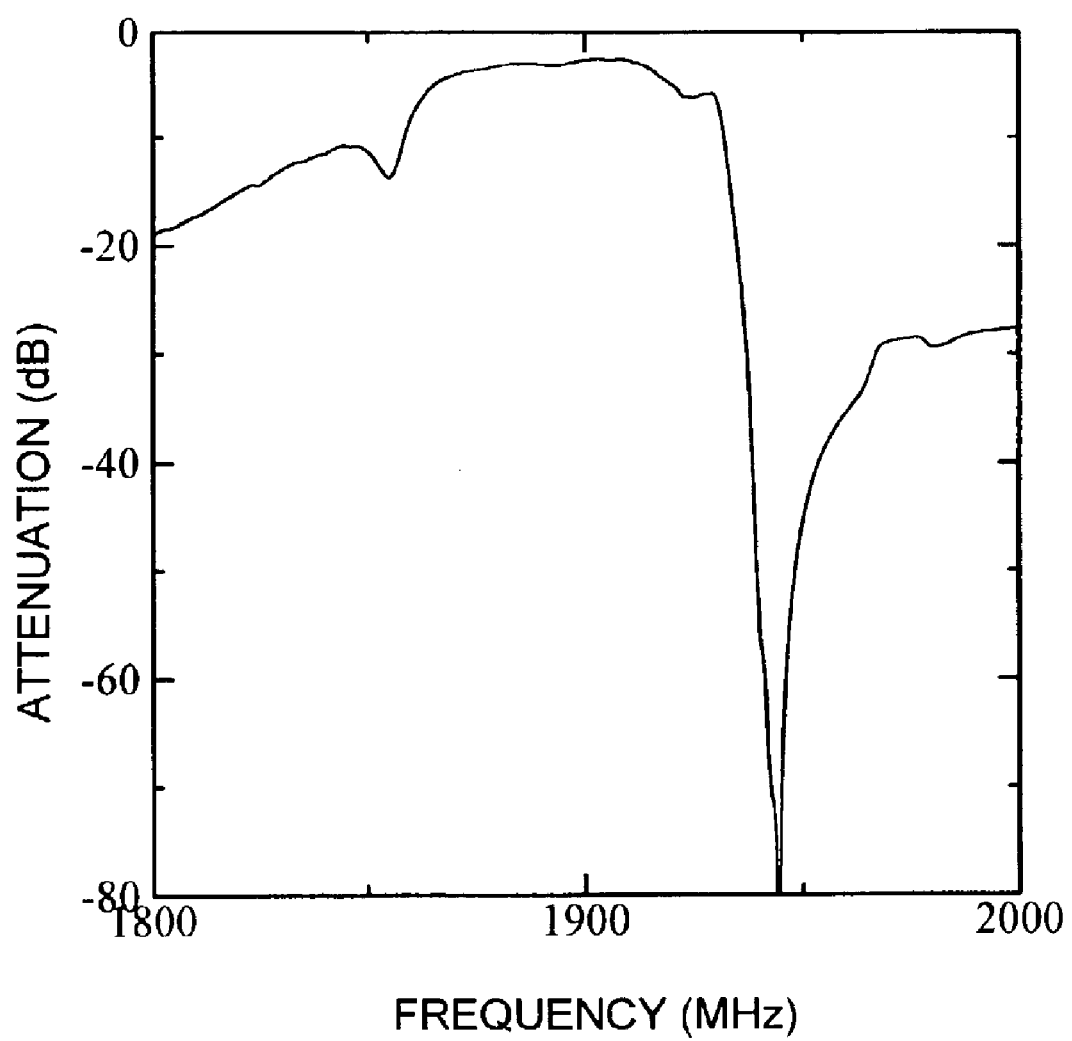
FIG. 9 is a graph of frequency characteristics of the SAW device according to the second embodiment of the present invention and the conventional SAW device.

FIG. 9 is a graph of the frequency characteristic of the SAW filter of FIG. 8 thus formed. The polarization inverted region $14_2$ is deeper than that used in the first embodiment of the present invention shown in FIG. 7. Thus, the SAW excitation efficiency is slightly degraded. However, the frequency-temperature characteristic of the resonators is –20 ppm/° C. and is therefore much improved. As a result, the frequency-temperature characteristic on the high frequency side of the pass band of the SAW filter shown in FIG. 9 is –30 ppm/° C. and is much improved.

Third Embodiment

Figure 10:
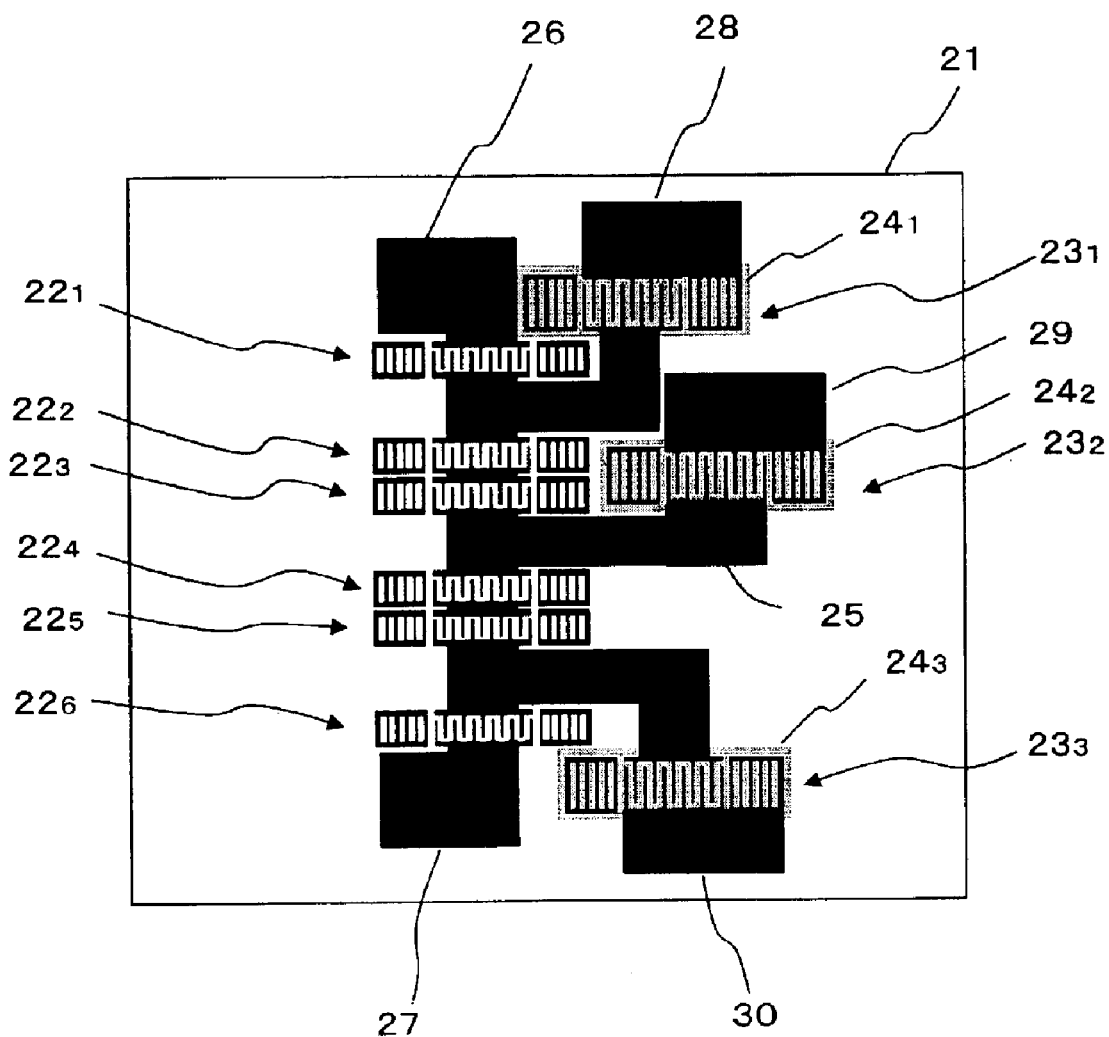
FIG. 10 is a plan view of a SAW device according to a third embodiment of the present invention.

FIG. 10 is a plan view of a SAW device according to a third embodiment of the present invention. This SAW device functions as a band-pass filter and has an arrangement in which only parallel-arm resonators are formed on polarization inverted regions. This minimizes degradation of the SAW excitation efficiency of the whole filter and provides good band-pass characteristics. In addition, the above-mentioned arrangement makes the rising end of the pass band on the low frequency side less affected by temperature change.

The SAW device has a chip 21 formed by a piezoelectric substrate on which six series-arm resonators $22_1$–$22_6$ and three parallel-arm resonators $23_1$–$23_3$ are formed. These resonators are connected by an interconnection pattern 25 so as to form a ladder arrangement. Each of the series-arm resonators $22_1$–$22_6$ and the parallel-arm resonators $23_1$–$23_3$ has a pair of comb-like electrodes and a pair of grating reflectors arranged so as to be interposed therebetween. The SAW device has an input terminal 26 and an output terminal 27. The SAW device has ground terminals 28, 29 and 30, which are respectively connected to the parallel-arm resonators $23_1$, $23_2$ and $23_3$. Polarization inverted regions $24_1$–$24_3$ formed in the main surface of the chip 21 are located just below the parallel-arm resonators $23_1$–$23_3$.

Figure 11:
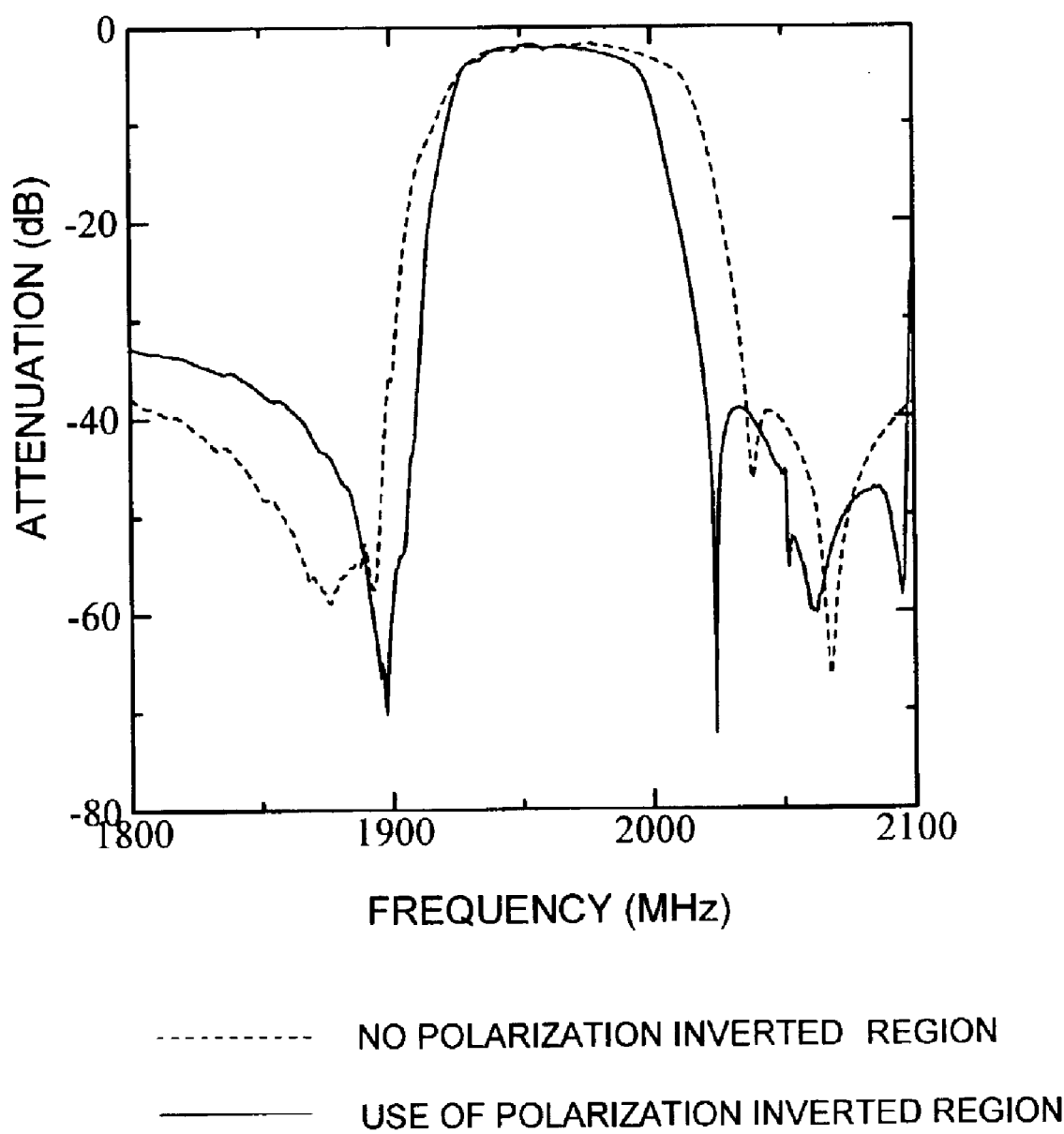
FIG. 11 is a graph of frequency characteristics of the SAW device according to the third embodiment of the present invention and the conventional SAW device.

FIG. 11 is a graph of the frequency characteristic of the SAW filter according to the third embodiment of the present invention. The polarization inverted regions $24_1$–$24_3$ provided to the parallel-arm resonators $23_1$–$23_3$ sharpen the rising end of the pass band on the low frequency side. In the conventional filter that does not have any polarization inverted region, it takes a frequency of 34 MHz to obtain a change of loss from −50 dB to −4 dB on the low frequency side of the pass band. In contrast, only a frequency of 23.8 MHz is needed to obtain the same change of loss by the SAW filter shown in FIG. 10. The frequency-temperature characteristic on the low frequency side of the pass band of the SAW filter shown in FIG. 10 is −35 ppm/° C. and is improved by 3 ppm/° C., as compared to the conventional filter that has a frequency-temperature characteristic of −38 ppm/° C.

Fourth Embodiment

Figure 12:
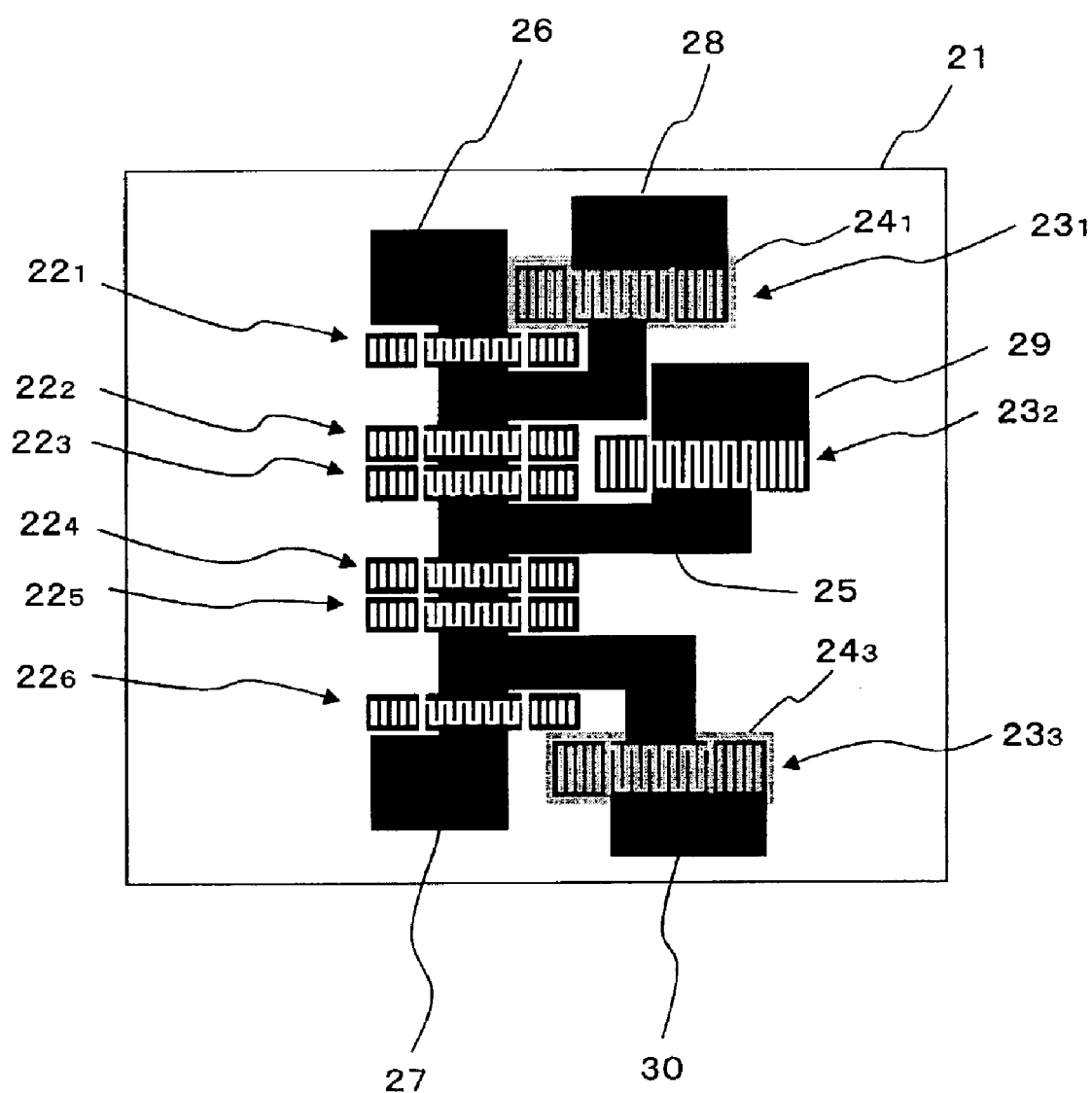
FIG. 12 is a plan view of a SAW device according to a fourth embodiment of the present invention.

FIG. 12 is a plan view of a SAW device according to a fourth embodiment of the present invention, in which parts that are the same as those shown in FIG. 10 are given the same reference numerals as previously. The SAW device of the present embodiment has the chip 21 formed by the piezoelectric element, wherein the parallel-arm resonator $23_2$ is formed directly on the chip 21, and the two parallel-arm resonators $23_1$ and $23_3$ are respectively formed on the polarization inverted regions $24_1$ and $24_3$. That is, the SAW filter of FIG. 12 has an arrangement such that only one or some of the parallel-arm resonators is provided with the polarization inverted region or regions. The SAW filter with the above arrangement has a smaller degree of improvement in the sharpness of the rising end of the pass band on the low frequency side and temperature stability. However, the SAW excitation efficiency is not degraded as much as that of the filter arrangement shown in FIG. 10. Thus, a comparatively broad pass-band of filters can be achieved.

Fifth Embodiment

Figure 13:
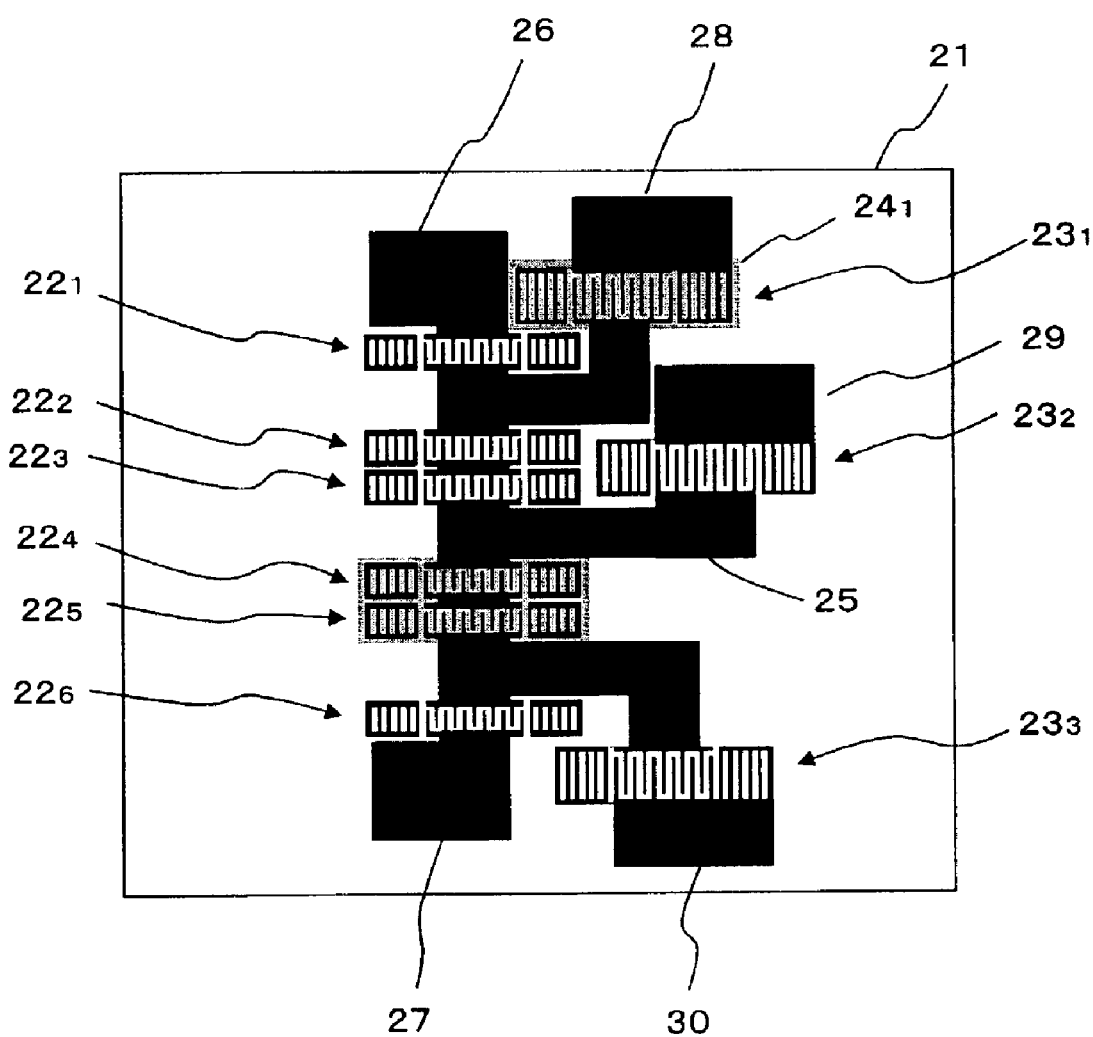
FIG. 13 is a plan view of a SAW device according to a fifth embodiment of the present invention.

FIG. 13 is a plan view of a SAW device according to a fifth embodiment of the present invention, wherein parts that are the same as those shown in the previously described figures are given the same reference numerals as previously. The SAW device has an arrangement in which polarization inverted regions are provided to one or some of the series-arm resonators and one or some of the parallel-arm resonators. In FIG. 13, only the series-arm resonators $22_4$ and $22_5$ among the series-arm resonators $22_1$–$22_6$ are given the polarization inverted region $24_4$, and only the parallel-arm resonator $23_1$ among the parallel-arm resonators $23_1$–$23_3$ are given the polarization inverted region $24_1$. The SAW filter with the above arrangement has a smaller degree of improvement in the sharpness of the rising end of the pass band on the low frequency side and temperature stability. However, the SAW excitation efficiency is not degraded as much as that of the filter arrangement shown in FIG. 10. Thus, a comparatively broad pass-band of filters can be achieved.

The polarization inverted regions are not limited to the arrangement shown in FIG. 13. For instance, the polarization inverted region $24_4$ may be applied to the series-arm resonators $22_2$ and $22_3$ or to the series-arm resonators $22_1$ and $22_6$ respectively provided on the input and output sides of the SAW device. It is also possible to provide the polarization inverted region to the parallel-arm resonator $23_2$ or $23_3$ in addition to or instead of the parallel-arm resonator $23_1$.

Sixth Embodiment

Figure 14:
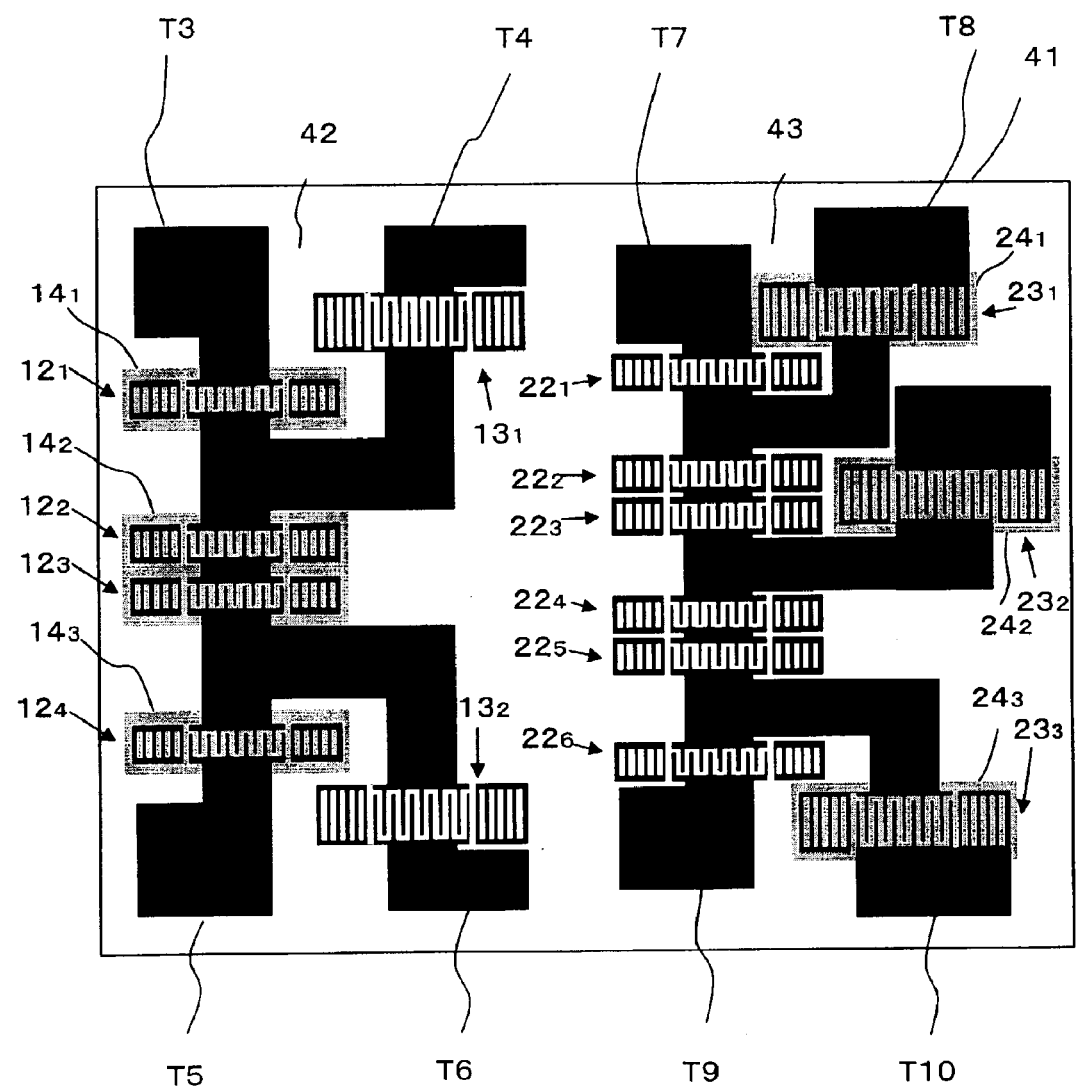
FIG. 14 is a plan view of a SAW device according to a sixth embodiment of the present invention.
Figure 15:
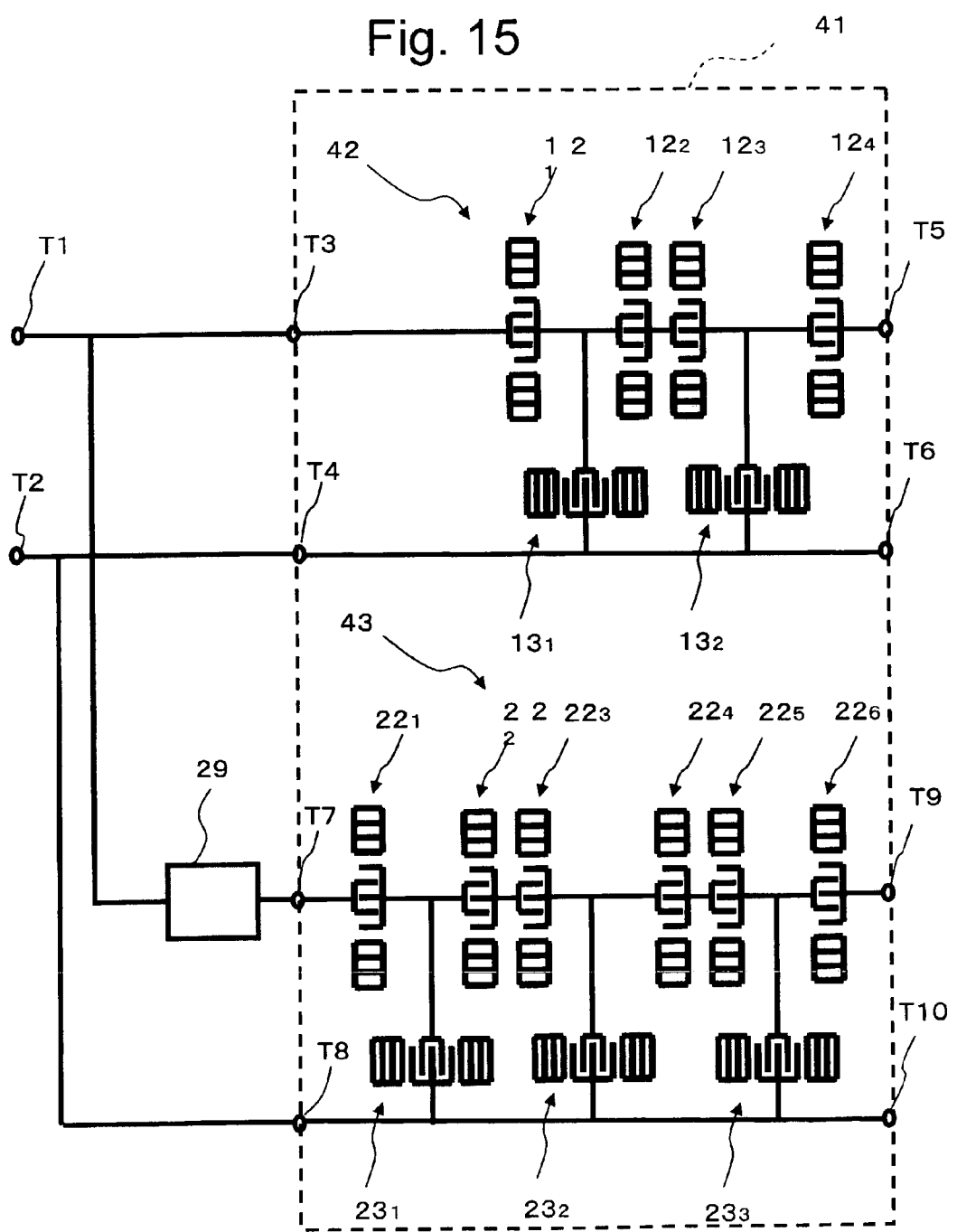
FIG. 15 is a circuit diagram of the entire structure of a duplexer with the SAW device shown in FIG. 14.

FIG. 14 is a plan view of a SAW device according to a sixth embodiment of the present invention, and FIG. 15 is a circuit diagram of a duplexer using the SAW device shown in FIG. 14. A transmitter (TX) filter 42 and a receiver (RX) filter 43 are formed on a chip formed by a piezoelectric substrate 41. The transmitter filter 42 has the same arrangement of resonators as shown in FIG. 3, and the receiver filter 43 has the same arrangement of resonators as shown in FIG. 10. Thus, the reference numerals used in FIGS. 3 and 10 are also used in FIG. 14. The duplexer has common terminals T1 and T2, and a phase matching circuit 29. The transmitter filter 42 has output terminals T3 and T4, and input terminals T5 and T6. The receiver filter 43 has input terminals T7 and T8, and output terminals T9 and T10.

In the transmitter filter 42, only the series-arm resonators $12_1$–$12_4$ are formed on the polarization inverted regions $14_1$–$14_3$, and the parallel-arm resonators $13_1$ and $13_2$ are formed directly on the piezoelectric substrate. In the receiver filter 43, only the parallel-arm resonators $23_{1-23_3}$ are formed on the polarization inverted regions $24_1$–$24_3$, and the series-arm resonators $22_1$–$22_6$ are formed directly on the piezoelectric substrate. The above arrangement of the polarization inverted regions is effective in a case where the pass band of the transmitter filter 42 is located at frequencies lower than those of the pass band of the receiver filter 43 and is close thereto. In case where the falling end of the pass band characteristic of the transmitter filter 42 is close to the rising end of the pass band characteristic of the receiver filter 43, these ends may overlap due to temperature variation, this causing interference between the transmitter filter 42 and the receiver filter 43. However, the sixth embodiment of the present invention is capable of avoiding such interference. This is because the falling end of the pass band characteristic of the transmitter filter 42 and the rising end of the pass band characteristic of the receiver filter 43 have improved temperature stability.

Figure 16:
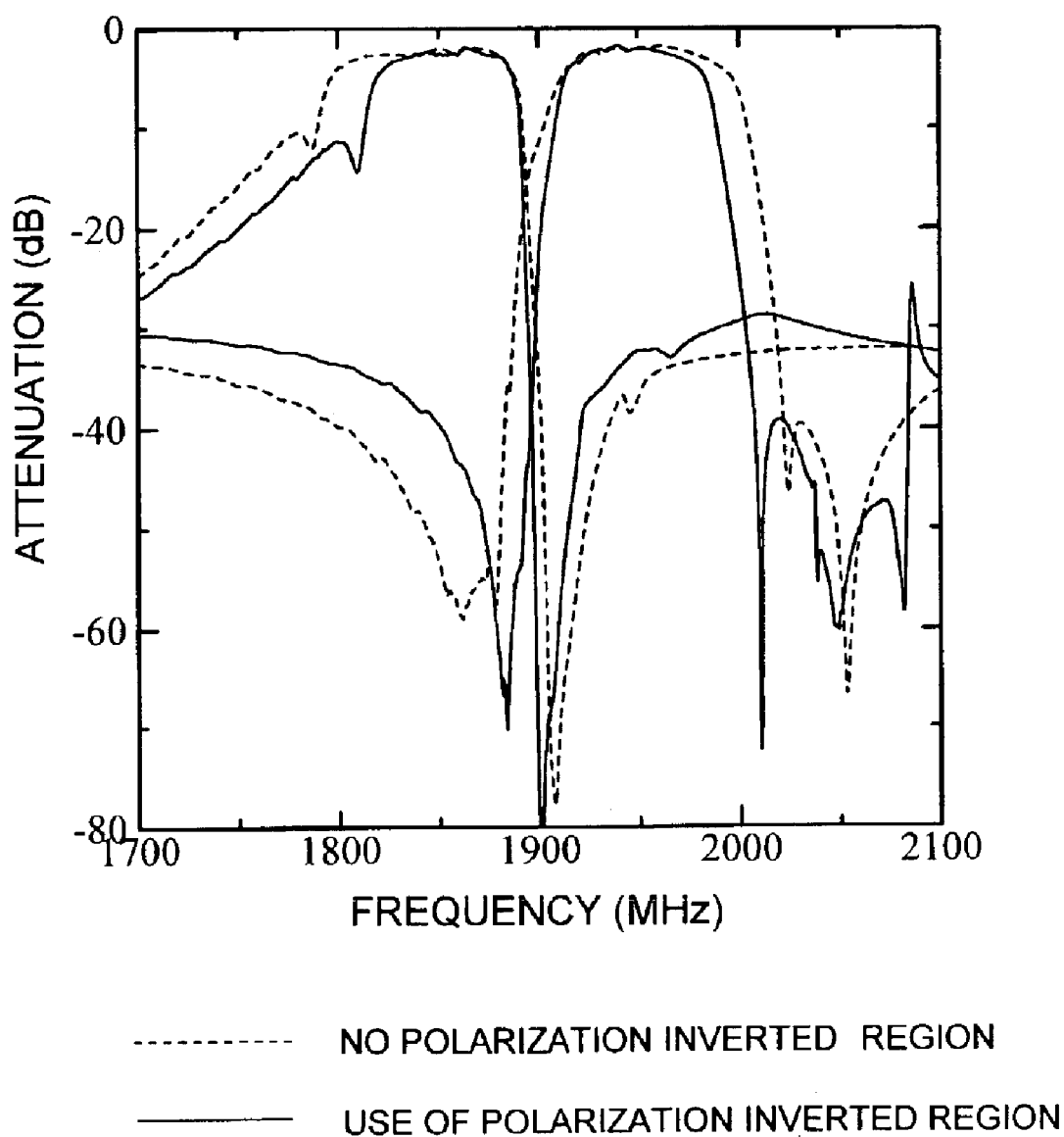
FIG. 16 is a graph of frequency characteristics of the SAW device according to the sixth embodiment of the present invention and the conventional SAW device.

FIG. 16 shows the frequency characteristic of the duplexer shown in FIG. 15 indicated by the solid line, and that of a conventional duplexer without any polarization inverted region. The conventional duplexer having no polarization inverted region has a large overlap of the pass bands of the transmitter and receiver filters. The large overlap makes it difficult to separate the transmitted signal in the transmitting band and the received signal in the receiving band. In contrast, the duplexer of the present embodiment has a small overlap of the pass band of the transmitter filter 42 and that of the receiver filter 43. This makes it possible to separate the transmitted and received signals in the transmitting and receiving bands very well.

The polarization inverted regions is not limited to the arrangement shown in FIG. 14. Only one or some of the series-arm resonators in the transmitter filter 42 may be formed on the polarization inverted region or regions. Similarly, only one or some of the parallel-arm resonators in the receiver filter 43 may be formed on the polarization inverted region or regions. It is also possible to apply the arrangement shown in FIG. 13 to each of the transmitter filter 42 and the receiver filter 43. That is, the polarization inverted regions are provided to one or some of the series-arm resonators and one or same of the parallel-arm resonators in each of the transmitter filter 42 and the receiver filter 43. In a case where the pass band of the transmitter filter 42 is located at frequencies higher than those of the pass band of the receiver filter 43, it is preferable to improve the temperature stability of the falling end of the pass band characteristic of the receiver filter and the rising end of the pass band characteristic of the transmitter filter. This may be done by applying the polarization inverted regions to the parallel-arm resonator of the transmitter filter and to the series-arm resonator of the receiver filter.

Seventh Embodiment

Figure 17:
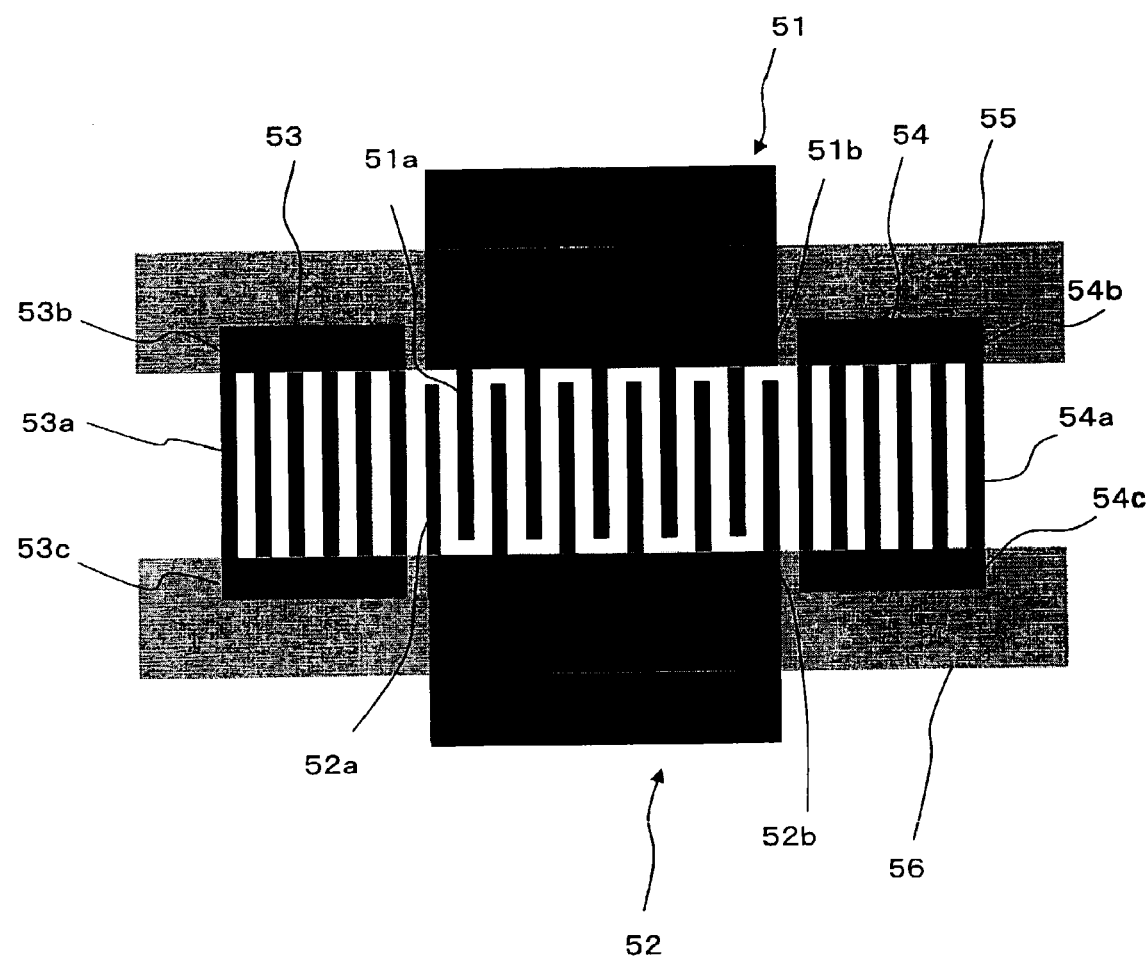
FIG. 17 is a plan view of a SAW device according to the seventh embodiment of the present invention.

FIG. 17 is a plan view of a SAW device (resonator) according to a seventh embodiment of the present invention. It will be noted that the first through sixth embodiments of the present invention employ the polarization inverted regions, each of which is uniformly formed under the pair of comb-like electrodes and the pair of reflectors of the SAW resonator. In contrast, a polarization inverted region employed by the seventh embodiment of the present invention is applied to a part of the SAW resonator. This type of polarization inverted region functions to confine the SAW and cause the SAW to propagate in the original propagating directions.

Referring to FIG. 17, the SAW resonator has a pair of comb-like electrodes 51 and 52 and a pair of reflectors 53 and 54, each of which reflectors is composed of a pair of comb-like electrodes (grating reflectors). The above electrodes are formed on a piezoelectric substrate. The comb-like electrode 51 has multiple electrode fingers 51a and a bus bar 51b. The bus bar 51b joins the electrode fingers 51a. The bus bar 51b shown in FIG. 17 is integrated into an interconnection line extending from the bus bar 51b. The width of the bus bar 51b itself may be equal to that of the bus bars of the reflectors 53 and 54. Similarly, the comb-like electrode 52 has multiple electrode fingers 52a and a bus bar 52b. The electrode fingers 51 and 52 are alternately arranged in the interdigital fashion. The overlapping portions of the electrode fingers 51a and 52a excite SAW. The reflector 53 is located in the SAW propagating direction, and is composed of electrodes 53a and two bus bars 53b and 53c. The electrode fingers 53a may be considered so that these fingers alternately extend from the bus bars 53b and 53c to the bus bars 53c and 53b. Similarly, the reflector 54 is located in the SAW propagating direction, and is composed of electrode fingers 54a and bus bars 54b and 54c.

The SAW resonator has two polarization inverted regions 55 and 56 between which the electrode fingers 51a, 52a, 53a and 54a are interposed. The polarization inverted region 55 is formed below the bus bars 51b, 53b and 54b. In other words, the bus bars 51b, 53b and 54b are formed on the polarization inverted region 55. Similarly, the polarization inverted region 56 is formed below the bus bars 52b, 53c and 54c. In other words, the bus bars 52b, 53c and 54c are formed on the polarization inverted region 56. Preferably, the polarization inverted regions 55 and 56 have a normalized depth h/λ where h denotes the depths thereof and λ is the SAW wavelength. The SAW velocity is reduced in the polarization inverted regions 55 and 56. This makes it possible to effectively confine the SAWs propagating obliquely towards the bus bars within the original propagation area in which the electrode fingers are provided.

Figure 18:
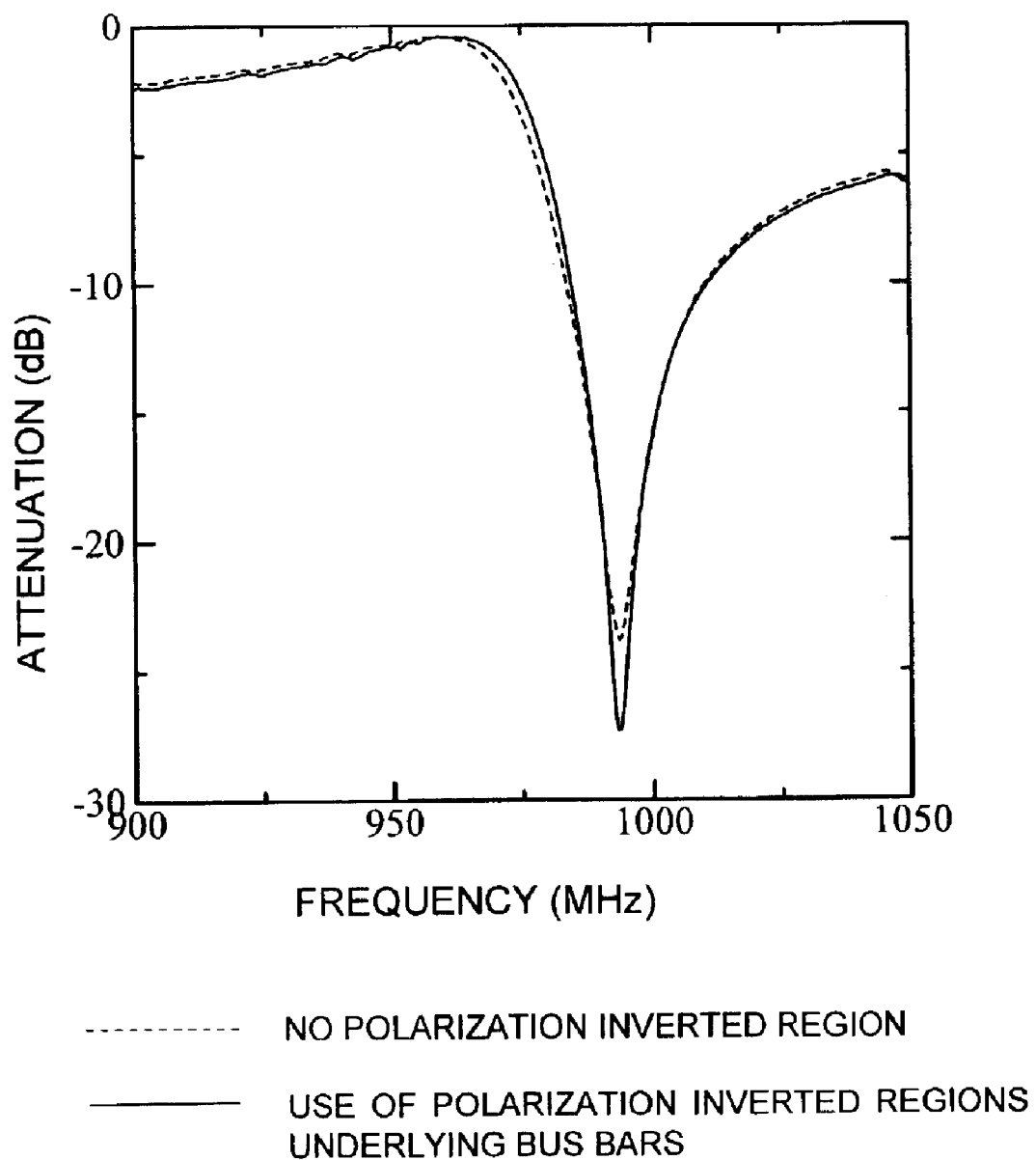
FIG. 18 is a graph of frequency characteristics of the SAW device according to the seventh embodiment of the present invention and the conventional SAW device.

FIG. 18 is a frequency characteristic of the SAW resonator shown in FIG. 17. Due to the confinement effect, according to the present embodiment, a large attenuation is available at the anti-resonance frequency as indicated by the solid line, as compared to that available by a conventional resonator without any polarization inverted region indicated by the broken line. The SAW resonator of the present embodiment has a sharper resonance response than the conventional resonator. Further, the SAW resonator of the present embodiment has a much improved SAW excitation efficiency because the polarization inverted region is provided to a part of the SAW resonator.

The seventh embodiment of the present invention may be applied to any of the first through sixth embodiments. The polarization inverted regions of the first through sixth embodiments of the present invention may be replaced by those of the seventh embodiment.

Eighth Embodiment

Figure 19:
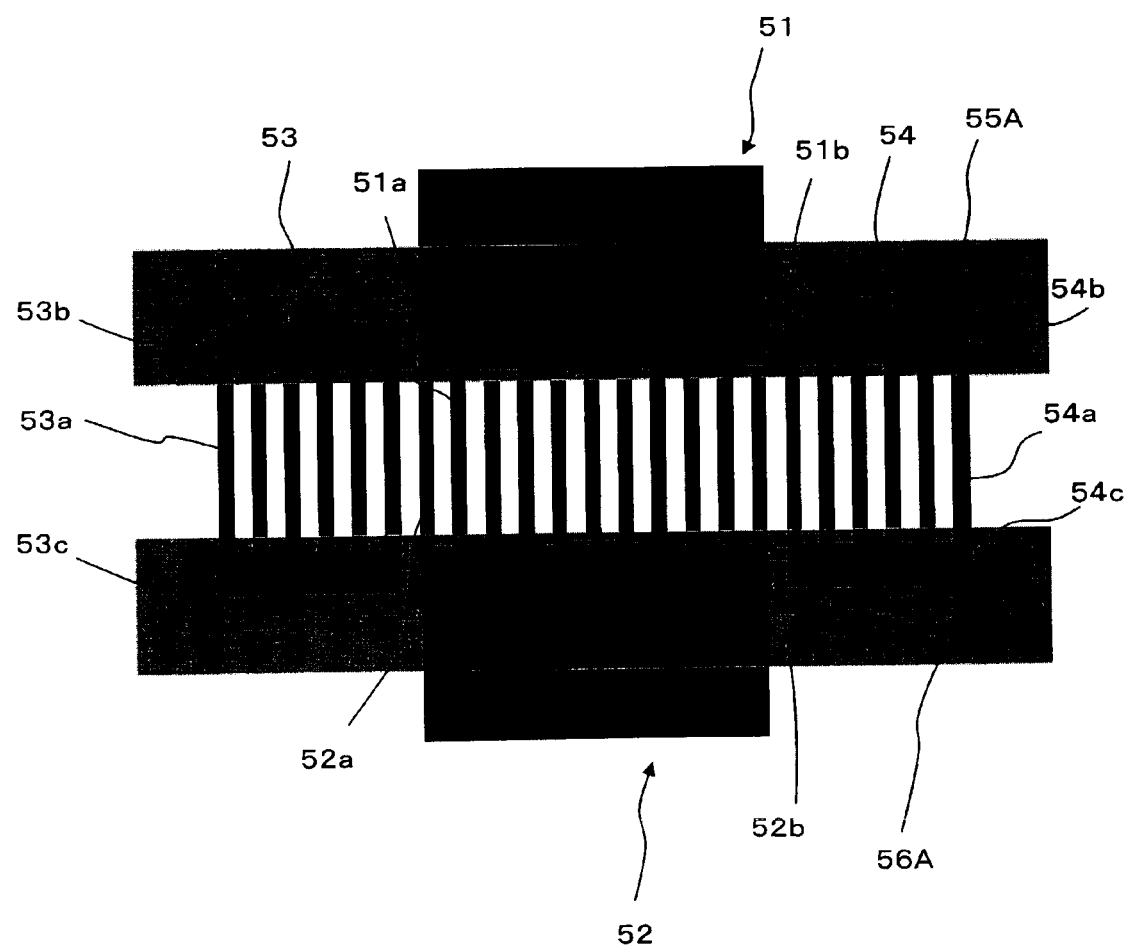
FIG. 19 is a plan view of a SAW device according to an eighth embodiment of the present invention.

FIG. 19 is a plan view of a SAW device (resonator) according to an eight embodiment of the present invention, in which parts that are the same as those shown in FIG. 17 are given the same reference numerals as previously. The eighth embodiment corresponds to a variation of the seventh embodiment. Polarization inverted regions 55A and 56A are applied not only to the bus bars but also to non-overlapping portions of the electrode fingers. More particularly, the polarization inverted region 55A is located not only below the bus bars 51b, 53b and 54b but also below first finger portions of the electrode fingers 51a that do not overlap the electrode fingers 52a and second finger portions of the electrode fingers 53a and 54a. The second finger portions are located on the same side as that of the first finger portions and have the same lengths as those of the first portions. Similarly, the polarization inverted region 56A is located not only below the bus bars 52b, 53c and 54c but also below third finger portions of the electrode fingers 52a that do not overlap the electrode fingers 51a and fourth finger portions of the electrode fingers 53a and 54a. The fourth finger portions are located on the same side as that of the third finger portions and have the same lengths as those of the third portions. The polarization inverted regions 55A and 56B thus arranged function to confine the SAW.

Figure 20:
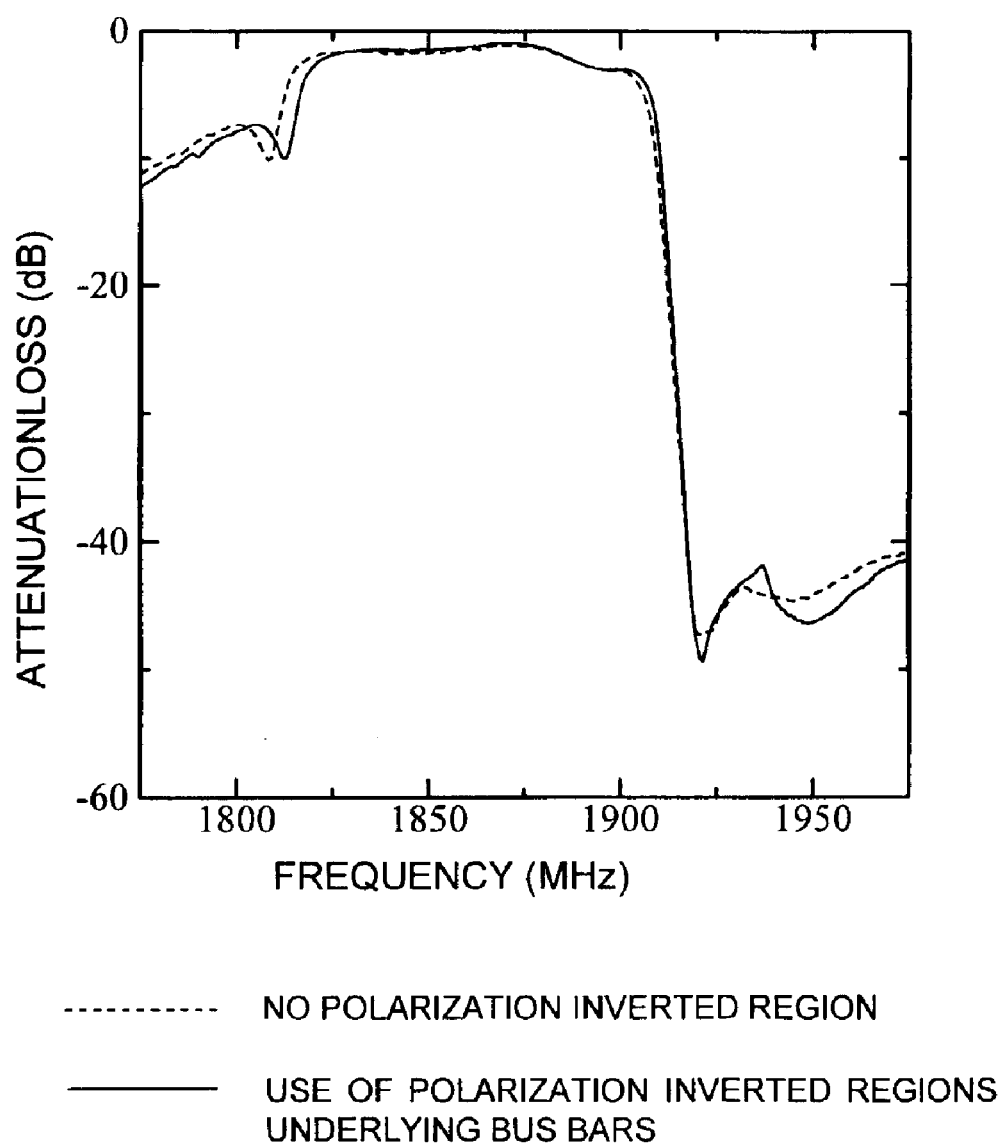
FIG. 20 is a graph of frequency characteristics of the SAW device according to the eighth embodiment of the present invention and the conventional SAW device.

The inventors experimentally manufactured a ladder type filter using multiple SAW resonators having the structure shown in FIG. 19. This SAW filter has four series-arm resonators and three parallel-arm resonators connected in the ladder arrangement. Each of the series-arm resonators has the structure shown in FIG. 19. The polarization inverted regions 55A and 56A were formed under the same condition as has been mentioned in connection with the second embodiment of the present invention. The polarization inverted regions 55A and 56A were approximately 1.5 µm deep. FIG. 20 is a frequency characteristic of the SAW filter thus manufactured experimentally. The solid line is the frequency characteristic of the SAW filter, and the broken line is the frequency characteristic of a conventional device that has the same ladder arrangement but does not have any polarization inverted region. The SAW filter of the invention has an improved sharpness of the falling end of the pass band on the high frequency side, as compared to the conventional device. More particularly, in the conventional device, it takes a frequency of 15 MHz to obtain a change of loss from −3.5 dB to −42 dB on the high frequency side of the pass band. In contrast, only a frequency of 13 MHz is needed to obtain the same change of loss by the SAW filter having the polarization inverted regions 55A and 56A. That is, a 2 MHz improvement of the shape factor can be obtained by the SAW filter of the present embodiment of the invention.

The polarization inverted regions according to the eighth embodiment of the present invention may be applied to the bus bars of the parallel-arm resonators instead of the series-arm resonators. This alternative contributes to improvement in the sharpness of the pass band on the low frequency side.

Ninth Embodiment

Figure 21:
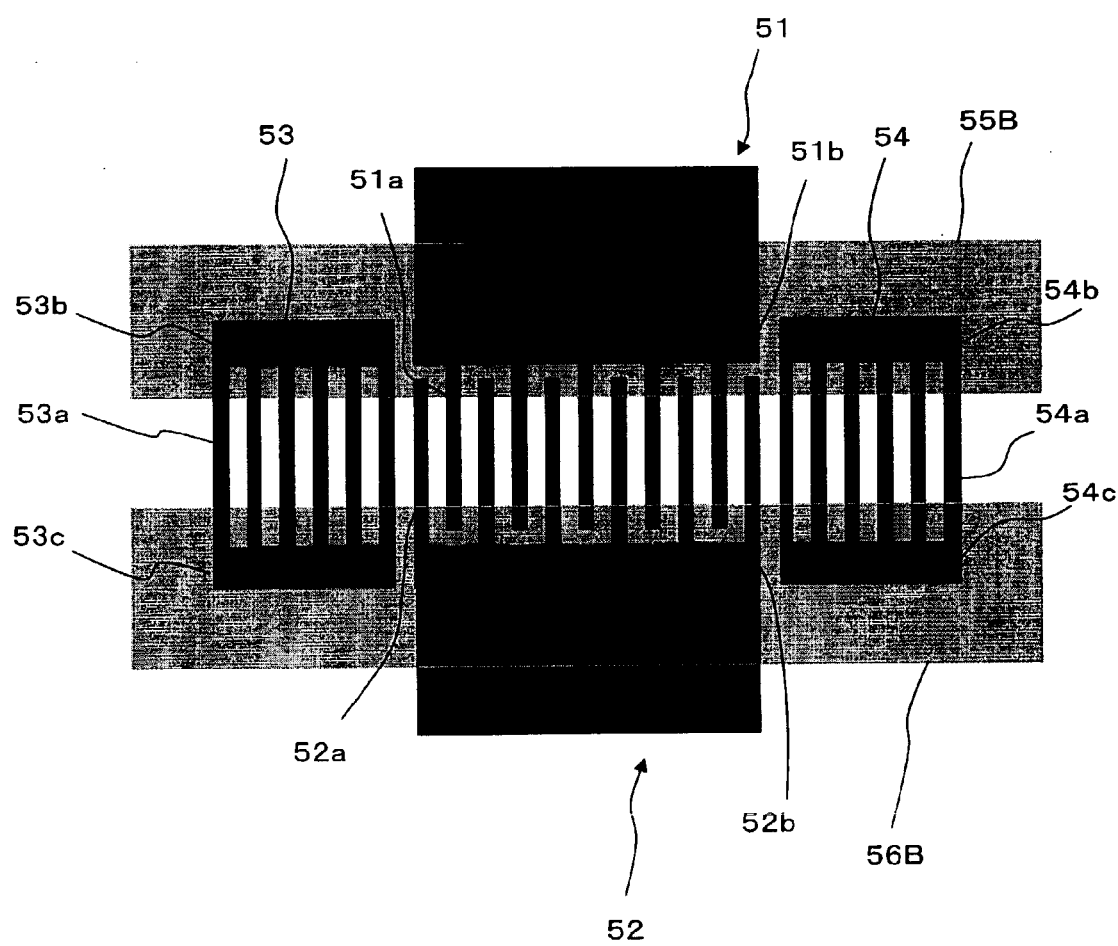
FIG. 21 is a plan view of a SAW device according to a ninth embodiment of the present invention.

FIG. 21 is a plan view of a SAW device (resonator) according to a ninth embodiment of the present invention, wherein the parts that are the same as those shown in FIGS. 17 and 19 are given the same reference numerals as previously. The SAW resonator has polarization inverted regions 55B and 56B, which are obtained by slightly extending the polarization inverted regions 55A and 56A inwards. The polarization inverted regions 55B and 56B underlie a part of each of the overlapping finger portions. The remaining part of each of the overlapping finger portions is formed directly on the piezoelectric substrate. The SAW excited by the electrode fingers is confined in the zone sandwiched between the polarization inverted regions 55B and 56B due to the difference in the SAW velocity. Thus, the SAW device shown in FIG. 21 has a frequency characteristic similar to that shown in FIG. 18.

Tenth Embodiment

Figure 22:
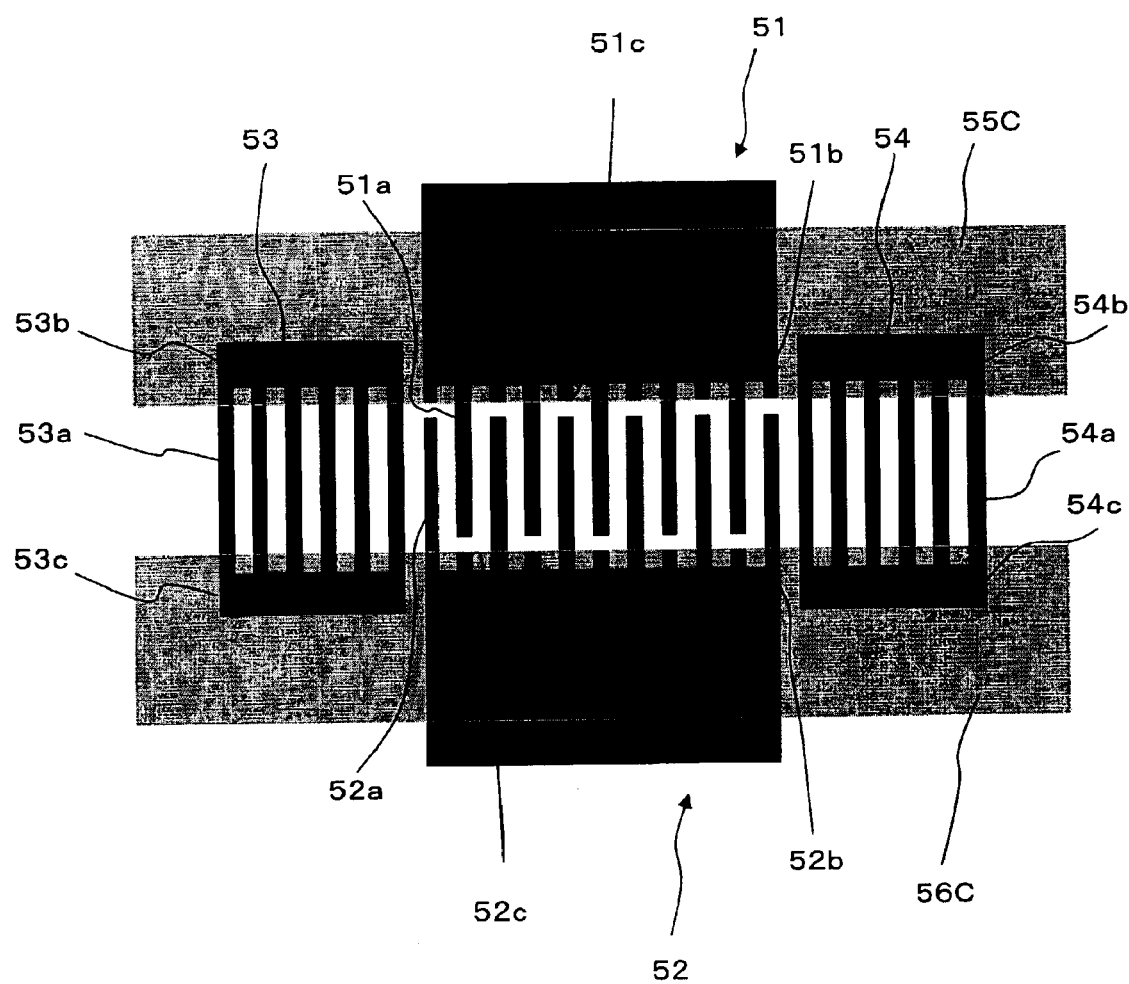
FIG. 22 is a plan view of a SAW device according to a tenth embodiment of the present invention.

FIG. 22 is a plan view of a SAW device (resonator) according to a tenth embodiment of the present invention, in which parts that are the same as those shown in FIGS. 18, 19 and 21 are given the same reference numerals as previously. The comb-like electrodes 51 and 52 have dummy electrodes 51c and 52c, respectively. The dummy electrodes 51c and 52c function to confine the SAW. The dummy electrodes 51c extend from the bus bar 51b and face the ends of the electrode fingers 52a. Similarly, the dummy electrodes 52c extend from the bus bar 52b and fact the ends of the electrode fingers 51a. A polarization inverted region 55C is located below the bus bars 51b, 53b and 54b, the dummy electrodes 51c and the corresponding portions of the electrode fingers 53a and 54a. Similarly, a polarization inverted region 56C is located below the bus bars 52b, 53c and 54c, the dummy electrodes 52c and the corresponding portions of the electrode fingers 53a and 54a. The SAW device thus configured has a frequency characteristic similar to that shown in FIG. 20.

The arrangement shown in FIG. 22 may be changed variously. For example, the polarization inverted regions 55C and 56C may be applied to only the bus bars as shown in FIG. 17 or may be extended so as to be located below the non-overlapping finger portions as shown in FIG. 19. The polarization inverted regions 55C and 56C may be located under a part of each of the overlapping finger portions as shown in FIG. 21.

Strictly speaking, the SAW devices according to the seventh to tenth embodiments of the present invention have slightly different shape factors due to the difference in coverage of the polarization inverted regions. Therefore, the polarization inverted region that matches the desired shape factor or sharpness can be easily selected from the variations.

Eleventh Embodiment

Figure 23:
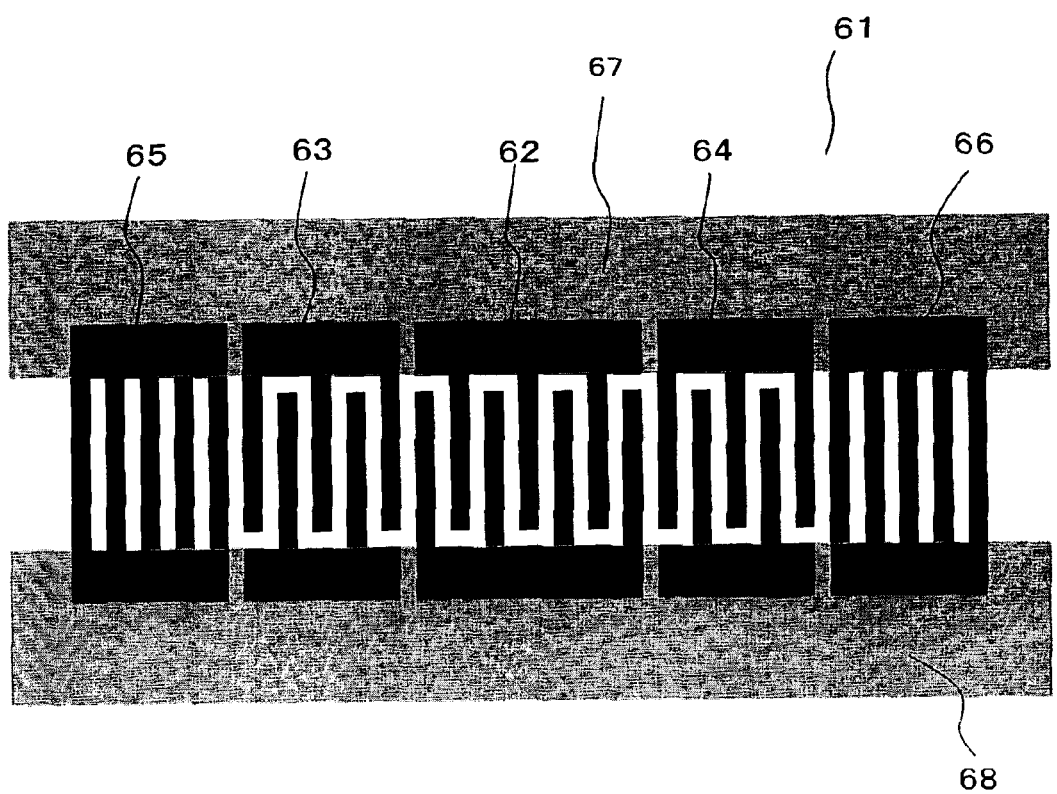
FIG. 23 is a plan view of a SAW device according to an eleventh embodiment of the present invention.
Figure 24:
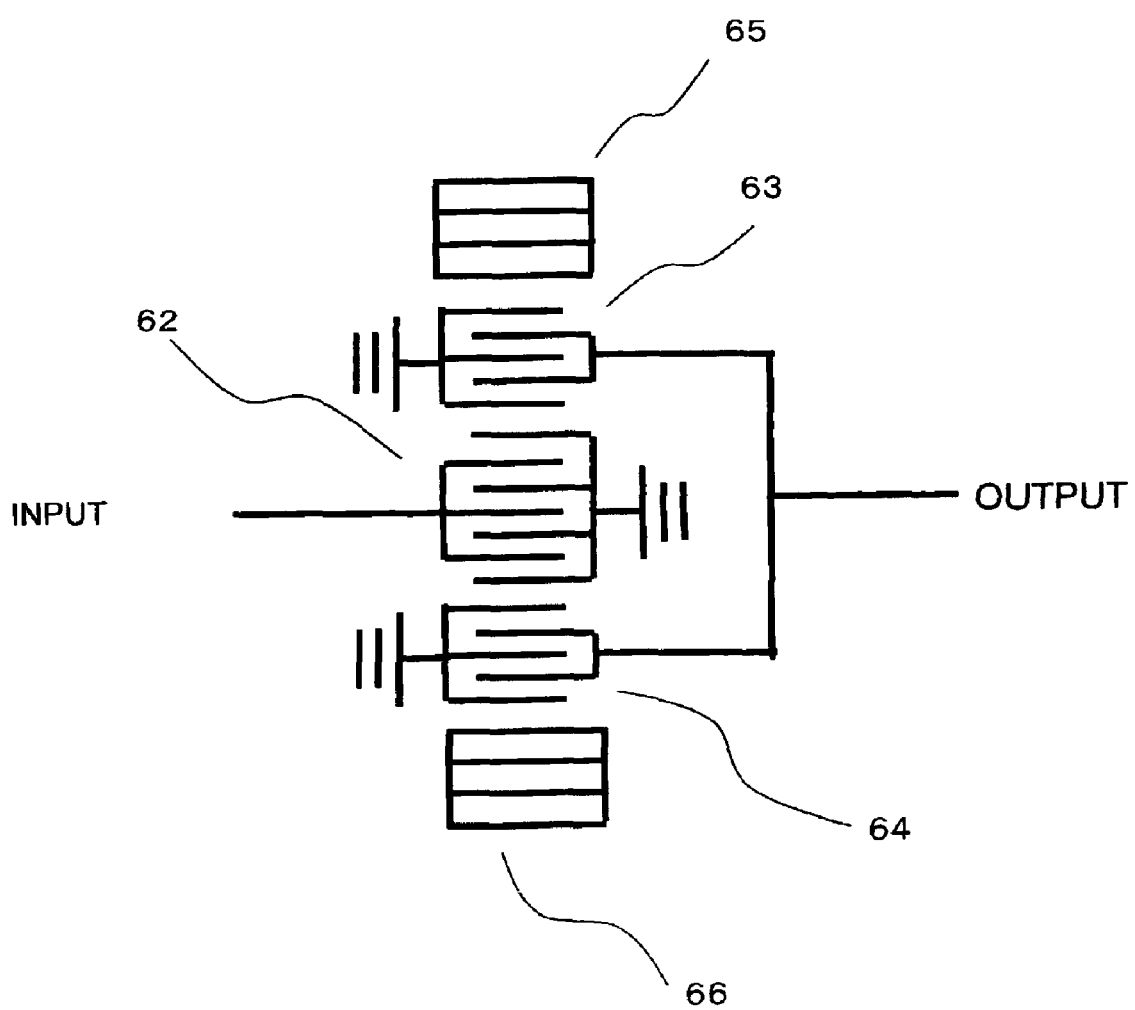
FIG. 24 is a diagram of a DMS filter using the SAW device shown in FIG. 23.

FIG. 23 is a plan view of a SAW device according to an eleventh embodiment of the present invention. This SAW device is a double mode SAW filter (hereinafter simply referred to as DMS filter). The DMS filter has a chip 61 formed by a piezoelectric substrate on which three pairs of comb-like electrodes 62–64 and two reflector electrodes 65 and 66 are arranged in line. These electrodes are connected as shown in FIG. 24. The pair 62 of comb-like electrodes serves as an input electrode of the SAW device, and the pairs of electrodes 63 and 64 serve as output terminals thereof. In FIG. 24, the pairs of comb-like electrodes 63 and 64 are connected to make a single output. Alternatively, the balanced output (complementary output) may be available from the output electrodes 63 and 64. The bus bars of the electrodes 62–66 are formed on polarization inverted regions 67 and 68. The DMS filter thus configured has a sharp filter response like the aforementioned SAW resonators.

The DMS filter is not limited to the polarization inverted regions 67 and 68 shown in FIG. 23, but may employ variations thereof. For example, the polarization inverted regions 67 and 68 may be varied so as to extend to the non-overlapping finger portions or a part of each of the overlapping finger portions as has been described with reference to FIGS. 19 and 21. For a DMS filter with the dummy electrodes, the polarization inverted regions 67 and 68 may be varied as shown in FIG. 22.

Figure 25:
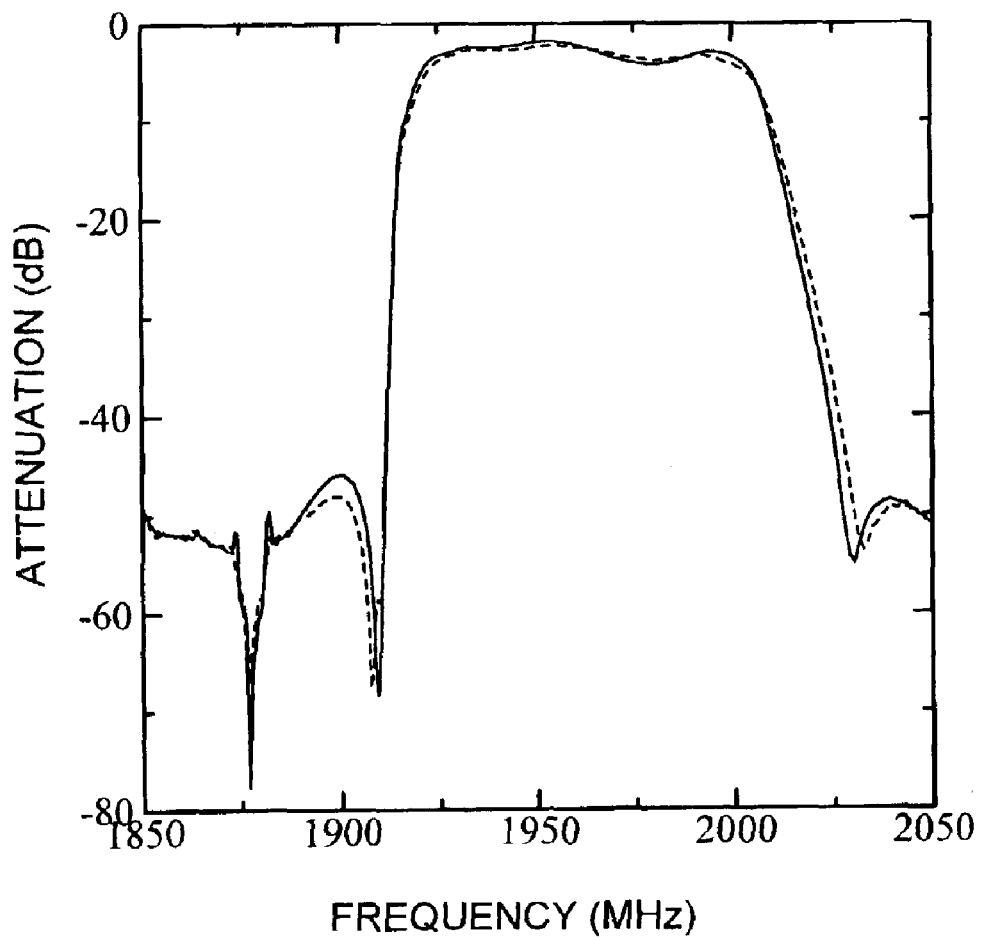
FIG. 25 is a graph of frequency characteristics of the DMS filter shown in FIG. 26 and a conventional DMS filter.
Figure 26:
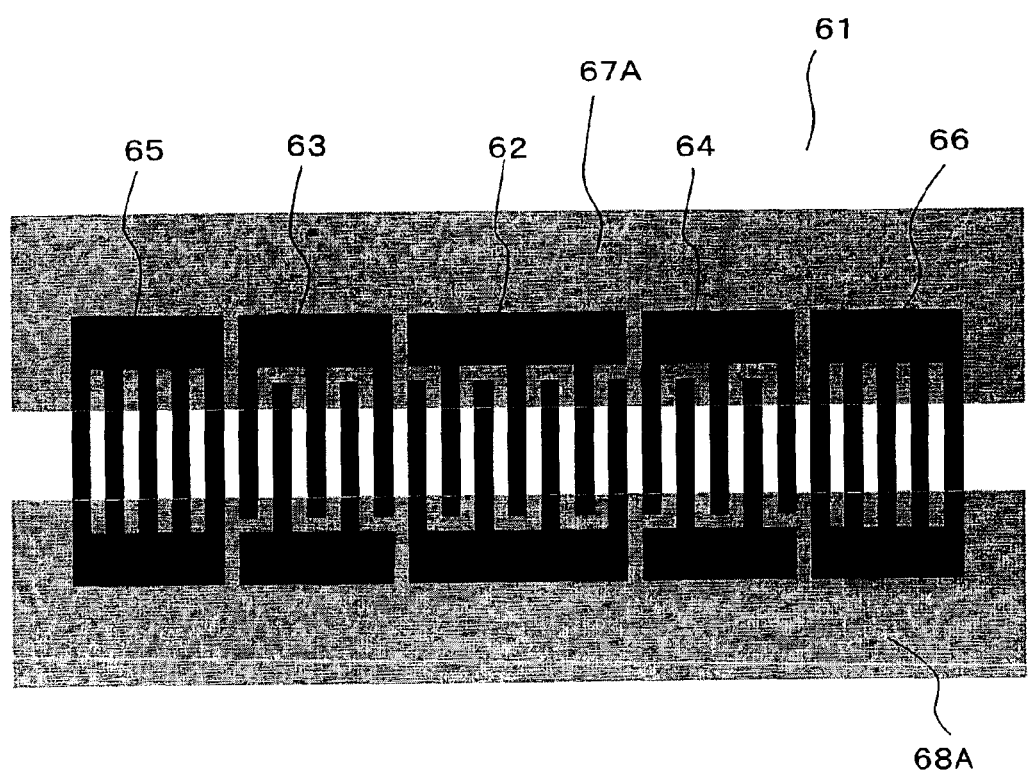
FIG. 26 is a plan view of a SAW device that is a variation of the tenth embodiment of the present invention.

FIG. 25 shows the frequency characteristic of a DMS filter shown in FIG. 26 indicated by the solid line. As is shown in FIG. 26, the DMS filter has polarization inverted regions 67A and 68A, which are defined by extending the polarization inverted regions 67 and 68 shown in FIG. 23 inwards so as to underlie a part of each of the overlapping finger portions. The polarization inverted regions 67A and 68A are formed under the same condition as that of the aforementioned second embodiment of the invention, and are approximately 1.5 82 m deep. A broken line shown in FIG. 25 is the frequency characteristic of a conventional DMS filter that does not have any polarization inverted regions. FIG. 25 shows that the DMS filter of the invention has improved sharpness on both the low and high frequency sides of the pass band. In the conventional DMS filter, it takes a frequency of 14 MHz to obtain a change of loss from −50 dB to −4 dB on the low frequency side of the pass band. In contrast, only a frequency of 11 MHz is needed to obtain the same change of loss by the DMS filter of the present embodiment having the polarization inverted regions 67A and 68A. That is, the sharpness on the low frequency side of the pass band is improved by 3 MHz according to the present embodiment. Further, in the conventional DMS filter, it takes a frequency of 32 MHz to obtain a change of loss from −4 dB to −50 dB on the high frequency side of the pass band. In contrast, only a frequency of 25 MHz is needed to obtain the same change of loss by the DMS filter of the present embodiment having the polarization inverted regions 67A and 68A. That is, the sharpness on the high frequency side of the pass band is improved by 7 MHz according to the present embodiment.

According to the present invention, it is possible to provide the SAW devices having improved SAW excitation efficiency and temperature characteristics and the SAW devices having improved SAW excitation efficiency and frequency characteristics.

The present application is based on Japanese Patent Application No. 2002-140876 fled on May 16, 2002, the entire disclosure of which is hereby incorporated by reference.

What is claimed is:

1. A surface acoustic wave device comprising:
   multiple SAW resonators formed on a piezoelectric substrate and connected in a ladder arrangement,
   the piezoelectric substrate having a polarization inverted region on which either a series-arm resonator only or a parallel-arm resonator only among the multiple SAW resonators is formed.

2. The surface acoustic wave device as claimed in claim 1, wherein at least one of series-arm resonators among the multiple SAW resonators is formed on the polarization inverted region.

3. The surface acoustic wave device as claimed in claim 1, wherein all of series-arm resonators among the multiple SAW resonators are formed on the polarization inverted region.

4. The surface acoustic wave device as claimed in claim 1, wherein at least one of parallel-arm resonators among the multiple SAW resonators is formed on the polarization inverted region.

5. The surface acoustic wave device as claimed in claim 1, wherein all of parallel-arm resonators among the multiple SAW resonators are formed on the polarization inverted region.

6. The surface acoustic wave device as claimed in claim 1, wherein the polarization inverted region is commonly applied to multiple resonators that are either series-arm resonators or parallel-arm resonators.

7. The surface acoustic wave device as claimed in claim 1, wherein the polarization inverted region has a depth equal to or less than twice a wavelength of a surface acoustic wave excited by the multiple SAW resonators.

8. A surface acoustic wave device comprising:
multiple SAW resonators formed on a piezoelectric substrate and connected in a ladder arrangement,
the piezoelectric substrate having a polarization inverted region on which only some of the multiple SAW resonators are formed.

9. The surface acoustic wave device as claimed in claim 8, wherein said some of the multiple SAW resonators includes at least one series-arm resonator and at least one parallel-arm resonator.

10. A surface acoustic wave device comprising:
first and second filters formed on a piezoelectric substrate each having a ladder arrangement of SAW resonators,
at least one of the SAW resonators of the first filter being formed on a polarization inverted region formed in the piezoelectric substrate,
at least one of the SAW resonators of the second filter being formed on another polarization inverted region formed in the piezoelectric substrate.

11. The surface acoustic wave device as claimed in claim 10, wherein:
series-arm resonators of the first filter are formed on the polarization inverted region; and
parallel-arm resonators of the second filter are formed on said another polarization inverted region.

12. The surface acoustic wave device as claimed in claim 11, wherein the first filter has a pass band located at frequencies lower than those of a pass band of the second filter.

13. The surface acoustic wave device as claimed in claim 10, wherein:
at least one of series-arm resonators of the first filter is formed on the polarization inverted region; and
at least one of parallel-arm resonators of the second filter is formed on said another polarization inverted region.

14. The surface acoustic wave device as claimed in claim 13, wherein the first filter has a pass band located at frequencies lower than those of a pass band of the second filter.

15. The surface acoustic wave device as claimed in claim 10, wherein:
all of series-arm resonators of the first filter are formed on the polarization inverted region; and
all of parallel-arm resonators of the second filter are formed on said another polarization inverted region.

16. The surface acoustic wave device as claimed in claim 15, wherein the first filter has a pass band located at frequencies lower than those of a pass band of the second filter.

17. The surface acoustic wave device as claimed in claim 10, wherein:
the first and second filters are respectively transmitter and receiver filters; and
the surface acoustic wave device is a duplexer.

18. The surface acoustic wave device as claimed in claim 17, wherein the transmitter filter has a pass band located at frequencies lower than those of a pass band of the receiver filter.

19. The surface acoustic wave device as claimed in claim 10, wherein:
the polarization inverted region has a depth equal to or less than twice a wavelength of a surface acoustic wave excited by the SAW resonators of the first filter; and
said another polarization inverted region has a depth equal to or less than twice a wavelength of a surface acoustic wave excited by the SAW resonators of the second filter.

20. A surface acoustic wave device comprising:
multiple SAW resonators formed on a piezoelectric substrate and connected in a ladder arrangement,
the piezoelectric substrate having a polarization inverted region on which either a series-arm resonator or a parallel-arm resonator among the multiple SAW resonators is formed;
wherein the polarization inverted region is separately applied to each of series-arm resonators or parallel-arm resonators.

21. A surface acoustic wave device comprising:
a piezoelectric substrate;
electrode fingers arranged in an interdigital fashion; and
polarization inverted regions that are formed in the piezoelectric substrate and are arranged so that the electrode fingers are interposed between the polarization inverted regions.

22. The surface acoustic wave device as claimed in claim 21, further comprising bus bars connecting the electrode fingers, the bus bars being formed on the polarization inverted regions.

23. The surface acoustic wave device as claimed in claim 21, wherein non-overlapping finger portions of the electrode fingers are located on the polarization inverted regions.

24. The surface acoustic wave device as claimed in claim 21, further comprising bus bars connecting the electrode fingers, wherein the polarization inverted regions underlie the bus bars, non-overlapping finger portions of the electrode fingers and a part of each of overlapping finger portions of the electrode fingers.

25. The surface acoustic wave device as claimed in claim 21, further comprising dummy electrodes formed on the polarization inverted regions.

26. The surface acoustic wave device as claimed in claim 21, wherein the electrode fingers and the polarization inverted regions are included in a SAW resonator that is one of SAW resonators connected in a ladder arrangement.

27. The surface acoustic wave device as claimed in claim 21, wherein the electrode fingers and the polarization inverted regions are included in a SAW resonator that is one of SAW resonators connected in a double mode SAW filter.

28. A surface acoustic wave devices comprising:
a substrate;
multiple pairs of comb-like electrodes formed on the substrate and arranged in line;
a pair of reflectors between which the multiple pairs of comb-like electrodes are arranged in line, the pair of reflectors being formed on the substrate; and polarization inverted regions formed in the substrate and arranged so as to confine surface acoustic waves excited by the multiple pairs of comb-like electrodes.

* * * * *

UNITED STATES PATENT AND TRADEMARK OFFICE
CERTIFICATE OF CORRECTION

PATENT NO.    : 6,903,630 B2
DATED         : June 7, 2005
INVENTOR(S)   : Miura et al.

It is certified that error appears in the above-identified patent and that said Letters Patent is hereby corrected as shown below:

<u>Title page,</u>
Item [73], Assignee, add the following name and address:
-- Fujitsu Limited, Kawasaki (JP) --.

Signed and Sealed this

Seventh Day of March, 2006

JON W. DUDAS
*Director of the United States Patent and Trademark Office*